United States Patent
Costa et al.

(10) Patent No.: US 10,692,840 B2
(45) Date of Patent: Jun. 23, 2020

(54) MICROELECTRONICS PACKAGE WITH SELF-ALIGNED STACKED-DIE ASSEMBLY

(71) Applicant: Qorvo US, Inc., Greensboro, NC (US)

(72) Inventors: Julio C. Costa, Oak Ridge, NC (US); George Maxim, Saratoga, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/695,579

(22) Filed: Sep. 5, 2017

(65) Prior Publication Data
US 2019/0074263 A1    Mar. 7, 2019

(51) Int. Cl.
*H01L 21/56* (2006.01)
*H01L 25/065* (2006.01)
(Continued)

(52) U.S. Cl.
CPC ........ *H01L 25/0657* (2013.01); *H01L 21/563* (2013.01); *H01L 23/3135* (2013.01); *H01L 24/80* (2013.01); *H01L 25/0652* (2013.01); *H01L 25/50* (2013.01); *H01L 23/3121* (2013.01); *H01L 24/08* (2013.01); *H01L 24/16* (2013.01); *H01L 2224/08145* (2013.01); *H01L 2224/16227* (2013.01); *H01L 2224/32145* (2013.01); *H01L 2224/73204* (2013.01); *H01L 2224/73253* (2013.01);
(Continued)

(58) Field of Classification Search
None
See application file for complete search history.

(56) References Cited

U.S. PATENT DOCUMENTS

| 4,093,562 A | 6/1978 | Kishimoto |
| 4,366,202 A | 12/1982 | Borovsky |

(Continued)

FOREIGN PATENT DOCUMENTS

| CN | 103811474 A | 5/2014 |
| CN | 103872012 A | 6/2014 |

(Continued)

OTHER PUBLICATIONS

U.S. Appl. No. 14/261,029, filed Apr. 24, 2014; now U.S. Pat. No. 9,214,337.
(Continued)

*Primary Examiner* — Ali Naraghi
(74) *Attorney, Agent, or Firm* — Withrow & Terranova, P.L.L.C.

(57) ABSTRACT

The present disclosure relates to a microelectronics package with a self-aligned stacked-die assembly and a process for making the same. The disclosed microelectronics package includes a module substrate, a first die with a first coupling component, a second die with a second coupling component, and a first mold compound. The first die is attached to the module substrate. The first mold compound resides over the module substrate, surrounds the first die, and extends above an upper surface of the first die to define a first opening. Herein, the first mold compound provides vertical walls of the first opening, which are aligned with edges of the first die in X-direction and Y-direction. The second die is stacked with the first die and in the first opening, such that the second coupling component is mirrored to the first coupling component.

21 Claims, 16 Drawing Sheets

(51) Int. Cl.
  *H01L 23/31* (2006.01)
  *H01L 23/00* (2006.01)
  *H01L 25/00* (2006.01)
(52) U.S. Cl.
  CPC .............. *H01L 2224/80904* (2013.01); *H01L 2224/92125* (2013.01); *H01L 2225/06517* (2013.01); *H01L 2225/06531* (2013.01); *H01L 2225/06534* (2013.01); *H01L 2225/06565* (2013.01); *H01L 2225/06593* (2013.01); *H01L 2924/14* (2013.01); *H01L 2924/1461* (2013.01); *H01L 2924/14215* (2013.01); *H01L 2924/19011* (2013.01); *H01L 2924/19041* (2013.01); *H01L 2924/19104* (2013.01); *H01L 2924/351* (2013.01)

(56) References Cited

U.S. PATENT DOCUMENTS

| | | | |
|---|---|---|---|
| 5,013,681 | A | 5/1991 | Godbey et al. |
| 5,061,663 | A | 10/1991 | Bolt et al. |
| 5,069,626 | A | 12/1991 | Patterson et al. |
| 5,362,972 | A | 11/1994 | Yazawa et al. |
| 5,391,257 | A | 2/1995 | Sullivan et al. |
| 5,459,368 | A | 10/1995 | Onishi et al. |
| 5,646,432 | A | 7/1997 | Iwaki et al. |
| 5,648,013 | A | 7/1997 | Uchida et al. |
| 5,699,027 | A | 12/1997 | Tsuji et al. |
| 5,709,960 | A | 1/1998 | Mays et al. |
| 5,729,075 | A | 3/1998 | Strain |
| 5,831,369 | A | 11/1998 | Fürbacher et al. |
| 5,920,142 | A | 7/1999 | Onishi et al. |
| 6,072,557 | A | 6/2000 | Kishimoto |
| 6,084,284 | A | 7/2000 | Adamic, Jr. |
| 6,154,366 | A | 11/2000 | Ma et al. |
| 6,154,372 | A | 11/2000 | Kalivas et al. |
| 6,235,554 | B1 | 5/2001 | Akram et al. |
| 6,236,061 | B1 | 5/2001 | Walpita |
| 6,268,654 | B1 | 7/2001 | Glenn et al. |
| 6,271,469 | B1 | 8/2001 | Ma et al. |
| 6,377,112 | B1 | 4/2002 | Rozsypal |
| 6,423,570 | B1 | 7/2002 | Ma et al. |
| 6,426,559 | B1 | 7/2002 | Bryan et al. |
| 6,446,316 | B1 | 9/2002 | Fürbacher et al. |
| 6,578,458 | B1 | 6/2003 | Akram et al. |
| 6,649,012 | B2 | 11/2003 | Masayuki et al. |
| 6,713,859 | B1 | 3/2004 | Ma |
| 6,841,413 | B2 | 1/2005 | Liu et al. |
| 6,864,156 | B1 | 3/2005 | Conn |
| 6,902,950 | B2 | 6/2005 | Ma et al. |
| 6,943,429 | B1 | 9/2005 | Glenn et al. |
| 6,964,889 | B2 | 11/2005 | Ma et al. |
| 6,992,400 | B2 | 1/2006 | Tikka et al. |
| 7,042,072 | B1 | 5/2006 | Kim et al. |
| 7,049,692 | B2 * | 5/2006 | Nishimura .......... H01L 23/3128 257/686 |
| 7,109,635 | B1 | 9/2006 | McClure et al. |
| 7,183,172 | B2 | 2/2007 | Lee et al. |
| 7,288,435 | B2 | 10/2007 | Aigner et al. |
| 7,307,003 | B2 | 12/2007 | Reif et al. |
| 7,393,770 | B2 | 7/2008 | Wood et al. |
| 7,427,824 | B2 | 9/2008 | Iwamoto et al. |
| 7,489,032 | B2 | 2/2009 | Jobetto |
| 7,596,849 | B1 | 10/2009 | Carpenter et al. |
| 7,619,347 | B1 | 11/2009 | Bhattacharjee |
| 7,635,636 | B2 | 12/2009 | McClure et al. |
| 7,714,535 | B2 | 5/2010 | Yamazaki et al. |
| 7,749,882 | B2 | 7/2010 | Kweon et al. |
| 7,790,543 | B2 | 9/2010 | Abadeer et al. |
| 7,843,072 | B1 * | 11/2010 | Park ...................... H01L 23/481 257/774 |
| 7,855,101 | B2 | 12/2010 | Furman et al. |
| 7,868,419 | B1 | 1/2011 | Kerr et al. |
| 7,960,218 | B2 | 6/2011 | Ma et al. |
| 8,004,089 | B2 | 8/2011 | Jobetto |
| 8,183,151 | B2 | 5/2012 | Lake |
| 8,420,447 | B2 | 4/2013 | Tay et al. |
| 8,503,186 | B2 | 8/2013 | Lin et al. |
| 8,643,148 | B2 | 2/2014 | Lin et al. |
| 8,664,044 | B2 | 3/2014 | Jin et al. |
| 8,772,853 | B2 | 7/2014 | Hong et al. |
| 8,791,532 | B2 | 7/2014 | Graf et al. |
| 8,802,495 | B2 | 8/2014 | Kim et al. |
| 8,803,242 | B2 | 8/2014 | Marino et al. |
| 8,816,407 | B2 | 8/2014 | Kim et al. |
| 8,835,978 | B2 | 9/2014 | Mauder et al. |
| 8,906,755 | B1 | 12/2014 | Hekmatshoartabari et al. |
| 8,921,990 | B2 | 12/2014 | Park et al. |
| 8,927,968 | B2 | 1/2015 | Cohen et al. |
| 8,941,248 | B2 | 1/2015 | Lin et al. |
| 8,963,321 | B2 | 2/2015 | Lenniger et al. |
| 8,983,399 | B2 | 3/2015 | Kawamura et al. |
| 9,165,793 | B1 | 10/2015 | Wang et al. |
| 9,349,700 | B2 | 5/2016 | Hsieh et al. |
| 9,368,429 | B2 | 6/2016 | Ma et al. |
| 9,461,001 | B1 | 10/2016 | Tsai et al. |
| 9,520,428 | B2 | 12/2016 | Fujimori |
| 9,530,709 | B2 | 12/2016 | Leipold et al. |
| 9,613,831 | B2 | 4/2017 | Morris et al. |
| 9,646,856 | B2 | 5/2017 | Meyer et al. |
| 9,653,428 | B1 | 5/2017 | Hiner et al. |
| 9,786,586 | B1 | 10/2017 | Shih |
| 9,824,974 | B2 | 11/2017 | Gao et al. |
| 9,859,254 | B1 | 1/2018 | Yu et al. |
| 9,875,971 | B2 | 1/2018 | Bhushan et al. |
| 9,941,245 | B2 | 4/2018 | Skeete et al. |
| 2001/0004131 | A1 | 6/2001 | Masayuki et al. |
| 2002/0070443 | A1 | 6/2002 | Mu et al. |
| 2002/0074641 | A1 | 6/2002 | Towle et al. |
| 2002/0127769 | A1 | 9/2002 | Ma et al. |
| 2002/0127780 | A1 | 9/2002 | Ma et al. |
| 2002/0137263 | A1 | 9/2002 | Towle et al. |
| 2002/0185675 | A1 | 12/2002 | Furukawa |
| 2003/0207515 | A1 | 11/2003 | Tan et al. |
| 2004/0164367 | A1 | 8/2004 | Park |
| 2004/0166642 | A1 | 8/2004 | Chen et al. |
| 2004/0219765 | A1 | 11/2004 | Reif et al. |
| 2005/0037595 | A1 | 2/2005 | Nakahata |
| 2005/0079686 | A1 | 4/2005 | Aigner et al. |
| 2005/0212419 | A1 | 9/2005 | Vazan et al. |
| 2006/0057782 | A1 | 3/2006 | Gardes et al. |
| 2006/0105496 | A1 | 5/2006 | Chen et al. |
| 2006/0108585 | A1 | 5/2006 | Gan et al. |
| 2006/0228074 | A1 | 10/2006 | Lipson et al. |
| 2006/0261446 | A1 | 11/2006 | Wood et al. |
| 2007/0020807 | A1 | 1/2007 | Geefay et al. |
| 2007/0069393 | A1 | 3/2007 | Asahi et al. |
| 2007/0075317 | A1 | 4/2007 | Kato et al. |
| 2007/0121326 | A1 | 5/2007 | Nall et al. |
| 2007/0158746 | A1 | 7/2007 | Ohguro |
| 2007/0181992 | A1 | 8/2007 | Lake |
| 2007/0190747 | A1 | 8/2007 | Humpston et al. |
| 2007/0252481 | A1 | 11/2007 | Iwamoto et al. |
| 2007/0276092 | A1 | 11/2007 | Kanae et al. |
| 2008/0050852 | A1 | 2/2008 | Hwang et al. |
| 2008/0050901 | A1 | 2/2008 | Kweon et al. |
| 2008/0164528 | A1 | 7/2008 | Cohen et al. |
| 2008/0265978 | A1 | 10/2008 | Englekirk |
| 2008/0272497 | A1 | 11/2008 | Lake |
| 2008/0315372 | A1 | 12/2008 | Kuan et al. |
| 2009/0008714 | A1 | 1/2009 | Chae |
| 2009/0010056 | A1 | 1/2009 | Kuo et al. |
| 2009/0014856 | A1 | 1/2009 | Knickerbocker |
| 2009/0179266 | A1 | 7/2009 | Abadeer et al. |
| 2009/0261460 | A1 | 10/2009 | Kuan et al. |
| 2010/0012354 | A1 | 1/2010 | Hedin et al. |
| 2010/0029045 | A1 | 2/2010 | Ramanathan et al. |
| 2010/0045145 | A1 | 2/2010 | Tsuda |
| 2010/0081232 | A1 | 4/2010 | Furman et al. |
| 2010/0081237 | A1 | 4/2010 | Wong et al. |
| 2010/0109122 | A1 | 5/2010 | Ding et al. |
| 2010/0120204 | A1 | 5/2010 | Kunimoto |
| 2010/0127340 | A1 | 5/2010 | Sugizaki |

(56) References Cited

U.S. PATENT DOCUMENTS

| | | |
|---|---|---|
| 2010/0173436 A1 | 7/2010 | Ouellet et al. |
| 2010/0200919 A1 | 8/2010 | Kikuchi |
| 2010/0314637 A1 | 12/2010 | Kim et al. |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0015131 A1 | 1/2014 | Meyer et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2014/0356602 A1 | 12/2014 | Oh et al. |
| 2015/0015321 A1 | 1/2015 | Dribinsky et al. |
| 2015/0108666 A1 | 4/2015 | Engelhardt et al. |
| 2015/0115416 A1 | 4/2015 | Costa et al. |
| 2015/0130045 A1 | 5/2015 | Tseng et al. |
| 2015/0136858 A1 | 5/2015 | Finn et al. |
| 2015/0197419 A1 | 7/2015 | Cheng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1* | 12/2015 | Jang .................. H01L 25/50 438/108 |
| 2015/0380523 A1 | 12/2015 | Hekmatshoartabari et al. |
| 2016/0002510 A1 | 1/2016 | Champagne et al. |
| 2016/0079137 A1 | 3/2016 | Leipold et al. |
| 2016/0093580 A1 | 3/2016 | Scanlan et al. |
| 2016/0100489 A1 | 4/2016 | Costa et al. |
| 2016/0126111 A1 | 5/2016 | Leipold et al. |
| 2016/0126196 A1 | 5/2016 | Leipold et al. |
| 2016/0133591 A1 | 5/2016 | Hong et al. |
| 2016/0155706 A1 | 6/2016 | Yoneyama et al. |
| 2016/0284568 A1 | 9/2016 | Morris et al. |
| 2016/0284570 A1 | 9/2016 | Morris et al. |
| 2016/0343592 A1 | 11/2016 | Costa et al. |
| 2016/0343604 A1 | 11/2016 | Costa et al. |
| 2016/0347609 A1 | 12/2016 | Yu et al. |
| 2016/0362292 A1 | 12/2016 | Chang et al. |
| 2017/0024503 A1 | 1/2017 | Connelly |
| 2017/0032957 A1 | 2/2017 | Costa et al. |
| 2017/0053938 A1 | 2/2017 | Whitefield |
| 2017/0098587 A1 | 4/2017 | Leipold et al. |
| 2017/0190572 A1 | 7/2017 | Pan et al. |
| 2017/0263539 A1 | 9/2017 | Gowda et al. |
| 2017/0271200 A1 | 9/2017 | Costa |
| 2017/0323804 A1* | 11/2017 | Costa .................. H01L 23/645 |
| 2018/0044169 A1 | 2/2018 | Hatcher, Jr. et al. |
| 2018/0044177 A1 | 2/2018 | Vandemeer et al. |
| 2018/0047653 A1 | 2/2018 | Costa et al. |
| 2018/0138082 A1 | 5/2018 | Costa et al. |
| 2018/0145678 A1 | 5/2018 | Maxim et al. |
| 2018/0269188 A1 | 9/2018 | Yu et al. |
| 2019/0172842 A1 | 6/2019 | Whitefield |
| 2019/0189599 A1 | 6/2019 | Baloglu et al. |

FOREIGN PATENT DOCUMENTS

| | | |
|---|---|---|
| EP | 2996143 A1 | 3/2016 |
| JP | S505733 Y1 | 2/1975 |
| JP | H11220077 A | 8/1999 |
| JP | 200293957 A | 3/2002 |
| JP | 2002252376 A | 9/2002 |
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| JP | 2011243596 A | 12/2011 |
| WO | 2007074651 A1 | 7/2007 |

OTHER PUBLICATIONS

U.S. Appl. No. 14/529,870, filed Oct. 31, 2014; now U.S. Pat No. 9,583,414.
U.S. Appl. No. 15/293,947, filed Oct. 14, 2016.
U.S. Appl. No. 14/715,830, filed May 19, 2015.
U.S. Appl. No. 15/616,109, filed Jun. 7, 2017.
U.S. Appl. No. 14/851,652, filed Sep. 11, 2015.
U.S. Appl. No. 14/872,910, filed Oct. 1, 2015.
U.S. Appl. No. 14/885,202, filed Oct. 16, 2015.
U.S. Appl. No. 14/885,243, filed Oct. 16, 2015; now U.S. Pat. No. 9,530,709.
U.S. Appl. No. 15/387,855, filed Dec. 22, 2016.
U.S. Appl. No. 14/959,129, filed Dec. 4, 2015, now U.S. Pat. No. 9,613,831.
U.S. Appl. No. 15/173,037, filed Jun. 3, 2016.
U.S. Appl. No. 15/648,082, filed Jul. 12, 2017.
U.S. Appl. No. 15/229,780, filed Aug. 5, 2016.
U.S. Appl. No. 15/262,457, filed Sep. 12, 2016.
U.S. Appl. No. 15/408,560, filed Jan. 18, 2017.
U.S. Appl. No. 15/287,202, filed Oct. 6, 2016.
U.S. Appl. No. 15/601,858, filed May 22, 2017.
U.S. Appl. No. 15/353,346, filed Nov. 16, 2016.
U.S. Appl. No. 15/652,826, filed Jul. 18, 2017.
U.S. Appl. No. 15/287,273, filed Oct. 6, 2016.
U.S. Appl. No. 15/498,040, filed Apr. 26, 2017.
U.S. Appl. No. 15/652,867, filed Jul. 18, 2017.
U.S. Appl. No. 15/491,064, filed Apr. 19, 2017.
U.S. Appl. No. 15/695,629, filed Sep. 5, 2017.
Non-Final Office Action for U.S. Appl. No. 15/795,915, dated Feb. 23, 2018, 6 pages.
Non-Final Office Action for U.S. Appl. No. 15/387,855, dated Jan. 16, 2018, 7 pages.

(56) References Cited

OTHER PUBLICATIONS

Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Jan. 17, 2018, 5 pages.
Supplemental Notice of Allowability for U.S. Appl. No. 15/287,273, dated Feb. 23, 2018, 5 pages.
Notice of Allowance for U.S. Appl. No. 15/498,040, dated Feb. 20, 2018, 8 pages.
Non-Final Office Action for U.S. Appl. No. 15/491,064, dated Jan. 2, 2018, 9 pages.
Non-Final Office Action for U.S. Appl. No. 15/676,415, dated Mar. 27, 2018, 14 pages.
Non-Final Office Action for U.S. Appl. No. 15/676,621, dated Mar. 26, 2018, 16 pages.
International Preliminary Report on Patentability for PCT/US2016/045809, dated Feb. 22, 2018, 8 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
International Search Report and Written Opinion for PCT/US2016/045809, dated Oct. 7, 2016, 11 pages.
Non-Final Office Action for U.S. Appl. No. 15/652,867, dated Oct. 10, 2017, 5 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx7MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 1 page.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.

(56) References Cited

OTHER PUBLICATIONS

Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of The Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q. et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, YE.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré C. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Notice of Allowance for U.S. Appl. No. 15/387,855, dated Aug. 10, 2018, 7 pages.
Notice of Allowance and Applicant-Initiated Interview Summary for U.S. Appl. No. 15/262,457, dated Sep. 28, 2018, 16 pages.
Notice of Allowance for U.S. Appl. No. 15/676,693, dated Jul. 20, 2018, 8 pages.
Corrected Notice of Allowance for U.S. Appl. No. 15/676,693, dated Aug. 29, 2018, 5 pages.
Notice of Allowance for U.S. Appl. No. 15/914,538, dated Aug. 1, 2018, 9 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.

(56) References Cited

OTHER PUBLICATIONS

Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Final Office Action for U.S. Appl. No. 13/852,648, dated Jul. 20, 2016, 14 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
Final Office Action for U.S. Appl. No. 15/616,109, dated Apr. 19, 2018, 18 pages.
Notice of Allowance for U.S. Appl. No. 15/795,915, dated Jun. 15, 2018, 7 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Non-Final Office Action for U.S. Appl. No. 15/676,693, dated May 3, 2018, 14 pages.
Final Office Action for U.S. Appl. No. 15/387,855, dated May 24, 2018, 9 pages.
Notice of Allowance for U.S. Appl. No. 15/695,629, dated Jul. 11, 2018, 12 pages.
Notice of Allowance for U.S. Appl. No. 15/789,107, dated May 18, 2018, 8 pages.
Notice of Allowance for U.S. Appl. No. 16/004,961, dated Jan. 11, 2019, 8 pages.
Notice of Allowance for U.S. Appl. No. 16/038,879, dated Jan. 9, 2019, 8 pages.
Non-Final Office Action for U.S. Appl. No. 15/945,418, dated Nov. 1, 2018, 13 pages.
Final Office Action for U.S. Appl. No. 15/601,858, dated Nov. 26, 2018, 16 pages.
Advisory Action for U.S. Appl. No. 15/601,858, dated Jan. 22, 2019, 3 pages.
First Office Action for Chinese Patent Application No. 201510746323.X, dated Nov. 2, 2018, 12 pages.
International Preliminary Report on Patentability for PCT/US2017/046744, dated Feb. 21, 2019, 11 pages.
International Preliminary Report on Patentability for PCT/US2017/046758, dated Feb. 21, 2019, 11 pages.
International Preliminary Report on Patentability for PCT/US2017/046779, dated Feb. 21, 2019, 11 pages.
Non-Final Office Action for U.S. Appl. No. 15/992,613, dated Feb. 27, 2019, 15 pages.
Non-Final Office Action for U.S. Appl. No. 15/601,858, dated Apr. 17, 2019, 9 pages.
Notice of Allowance for U.S. Appl. No. 16/004,961, dated May 13, 2019, 8 pages.
Final Office Action for U.S. Appl. No. 15/992,613, dated May 24, 2019, 11 pages.
Notice of Allowance for U.S. Appl. No. 15/992,639, dated May 9, 2019, 7 pages.
Non-Final Office Action for U.S. Appl. No. 15/873,152, dated May 24, 2019, 11 pages.
Lin, Yueh, Chin, et al., "Enhancement-Mode GaN MIS-HEMTs With LaHfOx Gate Insulator for Power Application," IEEE Electronic Device Letters, vol. 38, Issue 8, 2017, 4 pages.
Shukla, Shishir, et al., "GaN-on-Si Switched Mode RF Power Amplifiers for Non-Constant Envelope Signals," IEEE Topical Conference on RF/Microwave Power Amplifiers for Radio and Wireless Applications, 2017, pp. 88-91.

(56) References Cited

OTHER PUBLICATIONS

Tsai, Szu-Ping., et al., "Performance Enhancement of Flip-Chip Packaged AlGAaN/GaN HEMTs by Strain Engineering Design," IEEE Transcations on Electron Devices, vol. 63, Issue 10, Oct. 2016, pp. 3876-3881.
Tsai, Chun-Lin, et al., "Smart GaN platform; Performance & Challenges," IEEE International Electron Devices Meeting, 2017, 4 pages.
Notice of Reasons for Refusal for Japanese Patent Application No. 2015-180657, dated Jul. 9, 2019, 4 pages.
Notice of Allowance for U.S. Appl. No. 16/168,327, dated Jun. 28, 2019, 7 pages.
Notice of Allowance for U.S. Appl. No. 15/975,230, dated Jul. 22, 2019, 7 pages.
International Search Report and Written Opinion for International Patent Application No. PCT/US2019/034645, dated Sep. 19, 2019, 14 pages.
International Search Report and Written Opinion for International Patent Application No. PCT/US2019/034699, dated Oct. 29, 2019, 13 pages.
Non-Final Office Action for U.S. Appl. No. 16/204,214, dated Oct. 9, 2019, 15 pages.
Non-Final Office Action for U.S. Appl. No. 15/816,637, dated Oct. 31, 2019, 10 pages.
Advisory Action for U.S. Appl. No. 15/873,152, dated Oct. 11, 2019, 3 pages.
Notice of Allowance for U.S. Appl. No. 15/992,613, dated Sep. 23, 2019, 7 pages.
Notice of Allowance for U.S. Appl. No. 16/004,961, dated Aug. 28, 2019, 8 pages.
Notice of Allowance for U.S. Appl. No. 15/873,152, dated Dec. 10, 2019, 9 pages.
Office Action for Japanese Patent Application No. 2018-526613, dated Nov. 5, 2019, 8 pages.
International Search Report and Written Opinion for International Patent Application No. PCT/US2019/063460, dated Feb. 25, 2020, 14 pages.
International Search Report and Written Opinion for International Patent Application No. PCT/US2019/055317, dated Feb. 6, 2020, 17 pages.
International Search Report and Written Opinion for International Patent Application No. PCT/US2019/055321, dated Jan. 27, 2020, 23 pages.
Intention to Grant for European Patent Application No. 17757646.9, dated Feb. 27, 2020, 55 pages.
Final Office Action for U.S. Appl. No. 16/204,214, dated Mar. 6, 2020, 14 pages.
Non-Final Office Action for U.S. Appl. No. 16/527,702, dated Jan. 10, 2020, 10 pages.
Notice of Allowance for U.S. Appl. No. 16/038,879, dated Apr. 15, 2020, 9 pages.
Notice of Allowance for U.S. Appl. No. 15/816,637, dated Apr. 2, 2020, 8 pages.
Notice of Allowance for U.S. Appl. No. 16/004,961 dated Apr. 30, 2020, 8 pages.
Notice of Allowance for U.S. Appl. No. 16/527,702, dated Apr. 9, 2020, 8 pages.
Advisory Action for U.S. Appl. No. 16/204,214, dated Apr. 15, 2020, 3 pages.
Decision of Rejection for Japanese Patent Application No. 2015-180657, dated Mar. 17, 2020, 4 pages.
Examination Report for European Patent Application No. 16751791.1, dated Apr. 30, 2020, 15 pages.

\* cited by examiner

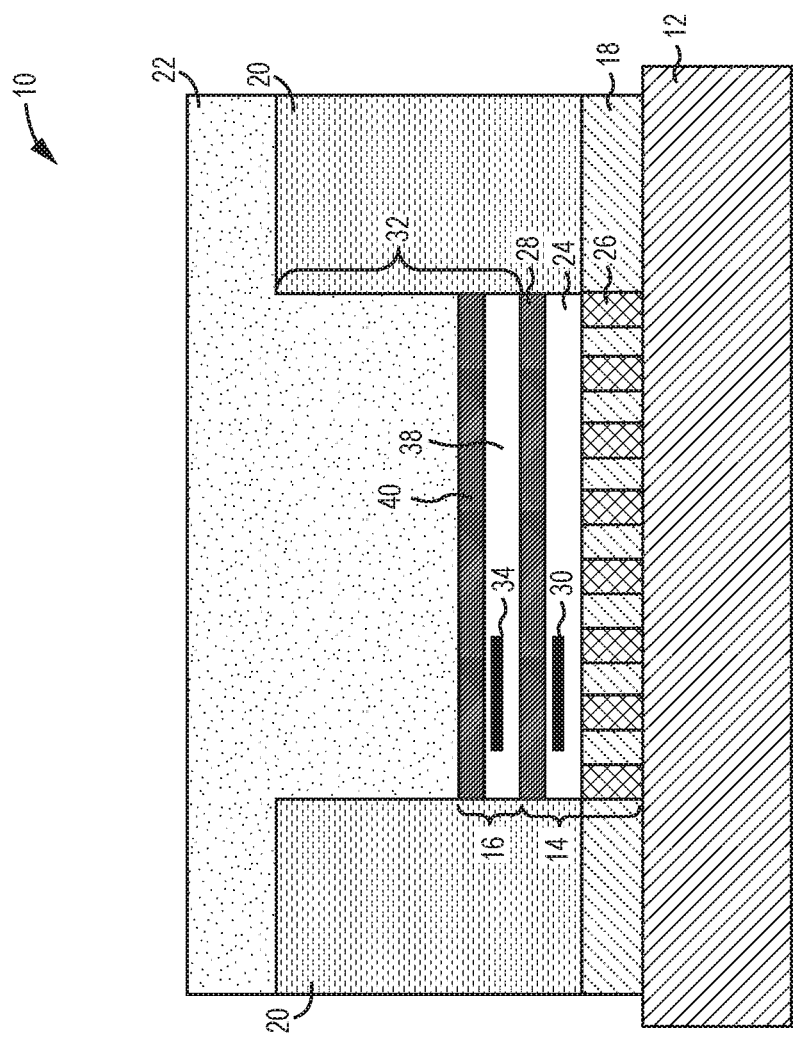

MICROELECTRONICS PACKAGE WITH SELF-ALIGNED STACKED-DIE ASSEMBLY

FIELD OF THE DISCLOSURE

The present disclosure relates to a microelectronics package and a process for making the same, and more particularly to a microelectronics package with a self-aligned stacked-die assembly, and a process to achieve self-alignment for the stacked dies in the microelectronics package.

BACKGROUND

With the popularity of portable consumer electronic products, such as smart phones, tablet computers, and so forth, stacked-die assemblies become more and more attractive in microelectronics packages to achieve electronics densification in a small footprint. However, traditional stacked-die assemblies suffer poor alignment between stacked semiconductor dies. Accurate alignment techniques, such as optical alignment, are very expensive and not preferred for low cost products. In addition, the thickness of each stacked semiconductor die may result in a large thickness of the microelectronics package, which may not meet low-profile requirements for modern portable products. Such low profile requirements limit significantly the number of the semiconductor dies that can be stacked.

In the microelectronics package, the stacked semiconductor dies may convey signals to each other by different coupling methods. In a front-end-module (FEM), for instance, an integrated circuit (IC) die may utilize capacitive coupling to transfer signals to a stacked filter die. The capacitive coupling has well defined capacitive coupling coefficients and does not suffer significantly from shifts and misalignments in a stacked-die assembly process. The key requirement for the capacitive coupling is to have electric connections between the stacked semiconductor dies. However, in some cases, like a flip chip die with no through-silicon vias used in the stacked-die assembly, such electric connections may not be available. Consequently, in these cases, magnetic coupling, which does not require electric connections, may be used to transfer signals between non-electrical-connection stacked dies. Herein, the signal transfer function is critically dependent on the precise value of magnetic coupling coefficients, and such precision in the magnetic coupling coefficients impose strict constraints on the stacked-die assembly and the way inductive coupling components are realized in the stacked dies.

In general, the magnetic coupling coefficients have a high degree of variability and depend both on the vertical distance between the inductive coupling components and the horizontal alignment in both X direction and Y-direction dimensions. The misalignment will be significant for a small size inductive coupling component when the horizontal shift is a significant percentage of the diameter of the inductive coupling component. For example, having a 50 µm misalignment is a reasonable value in the stacked-die assembly, but it may be 25% or more of the diameter of the small inductive coupling component. Such horizontal shifts will result in very large magnetic coupling coefficient variations and thus may significantly impact the signal transfer performance. Getting the variability of the magnetic coupling coefficients under control mandates horizontal shifts of 5 to 10 µm, which require expensive and complicated alignment techniques. Further, the distance between the inductive coupling components may also be impacted by the thicknesses of the stacked dies. A large distance between the inductive coupling components may result in lower magnetic coupling coefficients and thus less energy transferred between the stacked dies (more energy lost in the surroundings through escaped magnetic flux).

Accordingly, there remains a need for an improved stacked-die assembly in the microelectronics package, which improves the alignment of stacked dies and enhances the signal transferring performance without expensive and complicated processes. In addition, there is also a need to further reduce the thickness of the final product.

SUMMARY

The present disclosure relates to a microelectronics package with a self-aligned stacked-die assembly, and a process for making the same. The disclosed microelectronics package includes a module substrate, a first thinned flip chip die, a second die, and a first mold compound. The first thinned flip chip die includes a first device layer, a first dielectric layer residing over an upper surface of the first device layer, and a number of first interconnects extending from a lower surface of the first device layer to an upper surface of the module substrate. Herein, the first device layer includes a first coupling component embedded therein. The first mold compound resides over the upper surface of the module substrate, surrounds the first thinned flip chip die, and extends above an upper surface of the first thinned flip chip die to define a first opening within the first mold compound and vertically above the first thinned flip chip die. The first mold compound does not reside over the first thinned flip chip die and provides vertical walls of the first opening, which are aligned with edges of the first thinned flip chip die in both X-direction and Y-direction. Herein, the X-direction and the Y-direction are parallel to the upper surface of the module substrate, and the X-direction and the Y-direction are orthogonal to each other. The upper surface of the first thinned flip chip die is exposed at a bottom of the first opening. The second die is stacked with the first thinned flip chip die and in the first opening. The second die includes a second coupling component embedded therein, and the second coupling component is mirrored to the first coupling component.

In one embodiment of the microelectronics package, the second die has at least one of an X-direction dimension and a Y-direction dimension essentially the same as the first thinned flip chip die, such that the second die stacked in the first opening is self-aligned with the first thinned flip chip die.

In one embodiment of the microelectronics package, the second die has both the X-direction dimension and the Y-direction dimension essentially the same as the first thinned flip chip die, such that the second die stacked in the first opening is self-aligned with the first thinned flip chip die.

In one embodiment of the microelectronics package, the first thinned flip chip die and the second die do not have electrical connections.

In one embodiment of the microelectronics package, a distance between the first coupling component and the second coupling component is between 0.1 µm and 100 µm.

In one embodiment of the microelectronics package, the first coupling component and the second coupling component are inductive components, and the first coupling component is magnetically coupled to the second coupling component.

In one embodiment of the microelectronics package, the first coupling component and the second coupling component are photonic components, and the first coupling component is optically coupled to the second coupling component.

In one embodiment of the microelectronics package, the first thinned flip chip die and the second die convey signals to each other by one type of energy from a group consisting of electro-magnetic energy, optical energy, thermal energy, vibration mechanical energy, acoustic wave energy, and X-ray energy.

In one embodiment of the microelectronics package, the first thinned flip chip die is formed from a silicon-on-insulator (SOI) die. The first device layer of the first thinned flip chip die is a silicon epitaxy layer with integrated electronic components of the SOI die, and the first dielectric layer of the first thinned flip chip die is a buried oxide layer of the SOI die.

According to another embodiment, the microelectronics package further includes a second mold compound encapsulating the second die. Herein, the second mold compound is formed from a same or different material as the first mold compound.

In one embodiment of the microelectronics package, the first opening includes a lower region and an upper region that resides over the lower region. The second die resides within the lower region of the first opening, and the second mold compound fills the upper region of the first opening and is in contact with the second die.

In one embodiment of the microelectronics package, the second die extends vertically beyond the first opening. The second mold compound resides over the first mold compound and encapsulates the second die.

In one embodiment of the microelectronics package, an upper surface of the second die and an upper surface of the first mold compound are coplanar. A coating layer is applied over the upper surface of the first mold compound to encapsulate the second die.

In one embodiment of the microelectronics package, the second die is a thinned die that includes a second device layer and a second dielectric layer over the second device layer. The second device layer resides directly over the upper surface of the first thinned flip chip die, and the second coupling component is embedded in the second device layer.

According to another embodiment, the microelectronics package further includes a third die stacked with the first thinned flip chip die and the second die. The first opening includes a lower region and an upper region that resides over the lower region. The second die resides within the lower region of the first opening, and the third die resides over the second die and in the upper region of the first opening.

According to another embodiment, the microelectronics package further includes a third thinned flip chip die and a fourth die. The third thinned flip-chip die includes a second device layer, a second dielectric layer residing over an upper surface of the second device layer, and a number of second interconnects extending from a lower surface of the second device layer to the upper surface of the module substrate. The second device layer includes a third coupling component embedded therein. The first mold compound surrounds the third thinned flip chip die and extends above an upper surface of the third thinned flip chip die to define a second opening within the first mold compound and over the third thinned flip chip die. Herein, the upper surface of the third thinned flip chip die is exposed at a bottom of the second opening. The fourth die is stacked with the third thinned flip chip die and in the second opening. The fourth die includes a fourth coupling component embedded therein, and the fourth coupling component is mirrored to the third coupling component.

According to an exemplary process, a precursor package including a module substrate, a first flip-chip die, and a first mold compound is provided. The first flip chip die is attached to the upper surface of the module substrate, and the first mold compound is over and surrounding the first flip chip die. Herein, the first flip chip die includes a first device layer, a number of first interconnects extending from a lower surface of the first device layer to the upper surface of the module substrate, a first dielectric layer over an upper surface of the first device layer, and a first silicon substrate over the first dielectric layer. The first device layer includes a first coupling component embedded therein. Next, the first mold compound is thinned down to expose a backside of the first silicon substrate of the first flip chip die. The first silicon substrate is then removed substantially to form a first opening within the first mold compound and provide a first thinned flip chip die with an upper surface. The first mold compound provides vertical walls of the first opening, which are aligned with edges of the first thinned flip chip die in both X-direction and Y-direction. Herein, the X-direction and the Y-direction are parallel to the upper surface of the module substrate, and the X-direction and the Y-direction are orthogonal to each other. The upper surface of the first thinned flip chip die is exposed at a bottom of the first opening. After the first opening is formed, a second die is placed in the first opening to stack with the first thinned flip chip die. The second die includes a second coupling component embedded therein, and the second coupling component is mirrored to the first coupling component.

In one embodiment of the exemplary process, the second die has at least one of an X-direction dimension and a Y-direction dimension essentially the same as the first thinned flip chip die, such that the second die stacked in the first opening is self-aligned with the first thinned flip chip die.

In one embodiment of the exemplary process, the second die has both the X-direction dimension and the Y-direction dimension essentially the same as the first thinned flip chip die, such that the second die stacked in the first opening is self-aligned with the first thinned flip chip die.

In one embodiment of the exemplary process, the first thinned flip chip die and the second die do not have electrical connections.

In one embodiment of the exemplary process, the first thinned flip chip die and the second die convey signals to each other by one type of energy from a group consisting of electro-magnetic energy, optical energy, thermal energy, vibration mechanical energy, acoustic wave energy, and X-ray energy.

In one embodiment of the exemplary process, the first flip chip die is formed from a SOI die. The first device layer of the first flip chip die is a silicon epitaxy layer with integrated electronic components of the SOI die, the first dielectric layer of the first flip chip die is a buried oxide layer of the SOI die, and the first silicon substrate of the first flip chip die is a silicon substrate of the SOI die.

According to another embodiment, the exemplary process further includes applying a second mold compound to encapsulate the second die. Herein, the second mold compound is formed from a same or different material as the first mold compound.

In one embodiment of the exemplary process, applying the second mold compound is provided by one of a group consisting of sheet molding, overmolding, compression molding, transfer molding, dam fill encapsulation, and screen print encapsulation.

In one embodiment of the exemplary process, the second mold compound is applied with a molding pressure between 250 psi and 1000 psi. Herein, the second mold compound has a thermal conductivity greater than 2 W/m·K.

In one embodiment of the exemplary process, the second mold compound has a thermal conductivity less than 2 W/m·K.

In one embodiment of the exemplary process, the second die is formed from a laminate structure with at least one hole extending vertically through the second die, such that air elimination is allowed during placement of the second die in the first opening.

In one embodiment of the exemplary process, at least one of an X-direction dimension and a Y-direction dimension of the second die is between 0.5 μm and 10 μm smaller than the first opening, such that air elimination is allowed during placement of the second die in the first opening.

In one embodiment of the exemplary process, the second die is one of a group consisting of an integrated passive device (IPD) die, a low temperature cofired ceramic (LTCC) die, a bulk acoustic wave (BAW) filter die, a surface acoustic wave (SAW) filter die, a film bulk acoustic resonator (FBAR) filter die, and an active integrated circuit (IC) die.

In one embodiment of the exemplary process, the second die includes a second device layer over the upper surface of the first thinned flip chip die, a second dielectric layer over the second device layer, and a second silicon substrate over the second dielectric layer. The second coupling component is embedded in the second device layer.

According to another embodiment, the exemplary process further includes removing substantially the second silicon substrate to release a portion of the first opening and provide a second thinned die with an upper surface. The upper surface of the second thinned die is exposed to the released portion of the first opening.

According to another embodiment, the exemplary process further includes applying a second mold compound to fill the released portion of the first opening and encapsulate the second thinned die.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
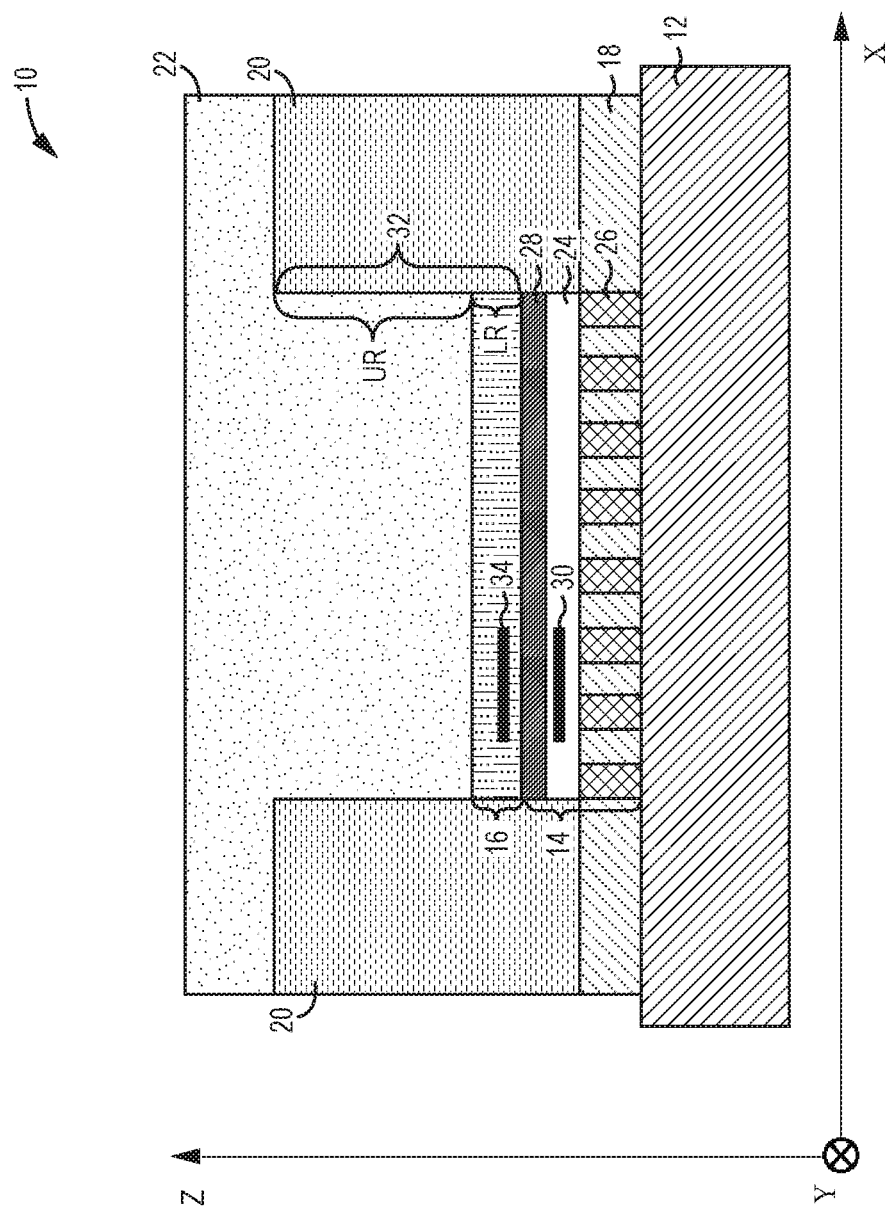
FIG. 1 shows an exemplary microelectronics package with one self-aligned die according to one embodiment of the present disclosure.

FIGS. 10A-10F provide exemplary steps that illustrate a process to fabricate the exemplary microelectronics package shown in FIG. 1.

Figure 4:
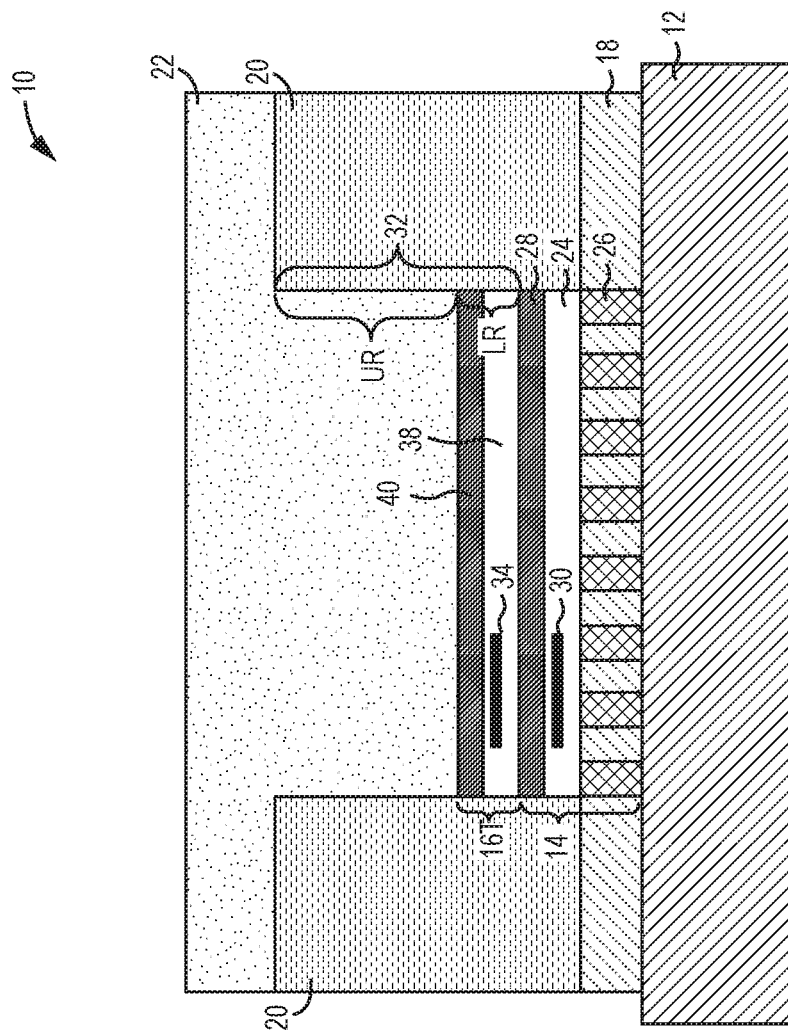
FIG. 4 shows an exemplary microelectronics package with one self-aligned thinned die according to one embodiment of the present disclosure.

FIGS. 11A-11G provide exemplary steps that illustrate a process to fabricate the exemplary microelectronics package shown in FIG. 4.

It will be understood that for clear illustrations, FIGS. 1-11G may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a microelectronics package with a self-aligned stacked-die assembly, and a process for making the same. FIG. 1 provides an exemplary microelectronics package 10 according to one embodiment of the present disclosure. For the purpose of this illustration, the exemplary microelectronics package 10 includes a module substrate 12, a thinned flip chip die 14, a second die 16, an underfilling layer 18, a first mold compound 20, and a second mold compound 22.

In detail, the module substrate 12 may be formed from a laminate, a wafer level fan out (WLFO) carrier, a lead frame, a ceramic carrier, or the like. The first thinned flip chip die 14 includes a first device layer 24, a number of first interconnects 26 (only one interconnect is labeled with a reference number for clarity) extending from a lower surface of the first device layer 24 and coupled to an upper surface of the module substrate 12, a first dielectric layer 28 over an upper surface of the first device layer 22, and essentially no silicon substrate over the first dielectric layer 28. Herein, essentially no silicon substrate over the first dielectric layer 28 refers to at most 0.25 µm silicon substrate (not shown) over the first dielectric layer 28. In some applications, the first thinned flip chip die 14 does not include any silicon substrate, such that an upper surface of the first thinned flip chip die 14 is an upper surface of the first dielectric layer 28. For other cases, the upper surface of the first thinned flip chip die 14 is an upper surface of the thin silicon substrate.

The first device layer 24 with a thickness between 0.1 µm and 50 µm may be formed of silicon, silicon oxide, gallium arsenide, gallium nitride, silicon germanium, or the like. A first inductive component 30 (such as inductor, transformer, transmission line, and coupler) is embedded within the first device layer 24. In different applications, there may be multiple inductive components included in the first device layer 24. The first interconnects 26 with a height between 5 µm and 200 µm may be copper pillar bumps, solder ball bumps, or the like. The first dielectric layer 28 with a thickness between 10 nm and 10000 nm may be formed of silicon oxide, silicon nitride, or aluminum nitride.

In one embodiment, the first thinned flip chip die 14 may be formed from a silicon-on-insulator (SOI) die, which refers to a die including a silicon substrate, a silicon epitaxy layer with integrated electronic components, and a buried oxide layer sandwiched between the silicon substrate and the silicon epitaxy layer. The first device layer 24 of the first thinned flip chip die 14 is the silicon epitaxy layer with the integrated electronic components of the SOI die. The first dielectric layer 28 of the first thinned flip chip die 14 is the buried oxide (BOX) layer of the SOI die. In addition, the silicon substrate of the SOI die is removed substantially to complete the first thinned flip chip die 14 (more details in the following discussion). In addition, the first thinned flip chip die 14 may also be formed from a silicon on sapphire (SOS) die, an integrated passive device (IPD) die, or an acoustic die, any of which has a device layer, a semiconductor substrate, and a stopping layer sandwiched between the device layer and the semiconductor substrate. The stopping layer may be formed of oxide or polymer and used as an etching stop to protect the device layer during an elimination process of the semiconductor substrate.

The underfilling layer 18 resides over the upper surface of the module substrate 12, such that the underfilling layer 18 encapsulates the first interconnects 26 and underfills the first thinned flip chip die 14 between the lower surface of the first device layer 24 and the upper surface of the module substrate 12. The underfilling layer 18 may be formed from conventional polymeric compounds, which serve to mitigate the stress effects caused by Coefficient of Thermal Expansion (CTE) mismatch between the first thinned flip chip die 14 and the module substrate 12.

The first mold compound 20 resides over the underfilling layer 18, surrounds the first thinned flip chip die 14, and extends above the upper surface of the first thinned flip chip die 14 to define a first opening 32 within the first mold compound 20 and vertically above the upper surface of the first thinned flip chip die 14. The first mold compound 20 does not reside over the first thinned flip chip die 14 and provides vertical walls of the first opening 32 in Z-direction. The vertical walls of the first opening 32 are well aligned with edges of the first thinned flip chip die 14 in both X-direction and Y-direction. Herein, the X-direction and the Y-direction are parallel to the upper surface of the module substrate 12, and the Z-direction is perpendicular to the upper surface of the module substrate 12. The X-direction, the Y-direction, and the Z-direction are all orthogonal to each other.

The first opening 32 includes a lower region LR and an upper region UR that resides over the lower region LR, and the upper surface of the first thinned flip chip die 14 is exposed to the lower region LR of the first opening 32. The first mold compound 20 may be formed from a same or different material as the underfilling layer 18. When the first mold compound 20 and the underfilling layer 18 are formed from a same material, the first mold compound 20 and the underfilling layer 18 may be formed simultaneously. One exemplary material used to form the first mold compound 20 is an organic epoxy resin system.

The second die 16 with a second inductive component 34 (such as inductor, transformer, transmission line, and coupler) is stacked with the first thinned flip chip die 14 and in the first opening 32. Herein, no electrical contact may be realized at the upper surface of the first thinned flip chip die 14 and all electrical contacts (not shown) are on the lower surface of the first device layer 24 where the first interconnects 26 extend from. As such, the first thinned flip chip die 14 and the second die 16 do not have electrical connections, and the first thinned flip chip die 14 and the second die 16 may convey signals to each other by magnetic coupling, which does not require such electrical connections. In this embodiment, the second inductive component 34 embedded in the second die 16 and the first inductive component 30 in the first thinned flip chip die 14 are magnetically coupled and used to transfer signals between the first thinned flip chip die 14 and the second die 16. The first thinned flip chip die 14 may be an active integrated circuit (IC) die, such as a switch IC die and a low noise amplifier (LNA) IC die. The second die 16 may be an IPD die, a low temperature cofired ceramic (LTCC) die, a bulk acoustic wave (BAW) filter die, a surface acoustic wave (SAW) filter die, a film bulk acoustic resonator (FBAR) filter die, and another active IC die.

The second die 16 has at least one of an X-direction dimension and a Y-direction dimension essentially the same as the first thinned flip chip die 14. Herein and hereinafter, an X-direction dimension refers to a largest dimension in the X-direction (between 100 µm to 1 mm or even larger), and a Y-direction dimension refers to a largest dimension in the Y-direction (between 100 µm to 1 mm or even larger). Further, essentially the same refers to between 95% and 100%. In detail, the X-direction dimension of the second die 16 may be between 95% and 100% of the X-direction dimension of the first thinned flip chip die 14, while the Y-direction dimension of the second die 16 may be smaller than the Y-direction dimension of the first thinned flip chip die 14. Alternatively, the Y-direction dimension of the second die 16 may be between 95% and 100% of the Y-direction dimension of the first thinned flip chip die 14, while the X-direction dimension of the second die 16 is smaller than the X-direction dimension of the first thinned flip chip die 14. In addition, the X-direction dimension of the second die 16 may be between 95% and 100% of the X-direction dimension of the first thinned flip chip die 14, and the Y-direction dimension of the second die 16 may be between 95% and 100% of the Y-direction dimension of the first thinned flip chip die 14. Consequently, at least one of the X-direction dimension and the Y-direction dimension of the second die 16 matches the first opening 32.

Notice that the first opening 32 is vertically over the first thinned flip chip die 14, and the first mold compound 20 provides the vertical walls of the first opening 32, which are well aligned with the edges of the first thinned flip chip die 14 in both the X-direction and the Y-direction. As such, the second die 16 stacked in the first opening 32 will be self-aligned with the first thinned flip chip die 14 due to the vertical walls of the first opening 32 provided by the first mold compound 20.

The precise alignment between the first flip chip die 14 and the second die 16 allows that the first inductive component 30 embedded in the first thinned flip chip die 14 is accurately mirrored to the second inductive component 34 embedded in the second die 16, and thus ensures stable magnetic coupling coefficients between the first inductive component 30 and the second inductive component 34 without an obvious variability. Consequently, this ensures a stable energy transfer between the magnetically coupled first and second inductive components 30 and 34. In addition, the stacked configuration of the first flip chip die 14 and the second die 16 significantly reduces the footprint of the microelectronics package 10, while the thinness of the first thinned flip chip die 14 preserves a low profile of the microelectronics package 10. Furthermore, the thinness of the first thinned flip chip die 14 allows a short distance between the first inductive component 30 and the second inductive component 34 between 0.1 µm and 100 µm, and consequently leads to high magnetic coupling coefficients.

In this embodiment, the second die 16 resides within the lower region LR of the first opening 32, and the second mold compound 22 fills the upper region UR of the first opening 32, is in contact with the second die 16, and encapsulates the second die 16. The second mold compound 22 may be formed of thermoplastics or thermoset materials with a thermal conductivity greater than 2 W/m·K, such as poly phenyl sulfide (PPS), overmold epoxies doped with boron nitride or alumina thermal additives, or the like. In general, the higher the thermal conductivity of the second mold compound 22, the better the thermal performance of the second die 16. In some applications, if the second die 16 is a low heat-generation die (such as a low-power filter die, a low-power capacitor die, or a MEMS die), the second mold compound 22 may also be formed from an organic epoxy resin system with a thermal conductivity less than 2 W/m·K. The second mold compound 22 may be formed of the same or different material as the first mold compound 20. Herein, a portion of the second mold compound 22 may reside over a top surface of the first mold compound 20.

Figure 2:
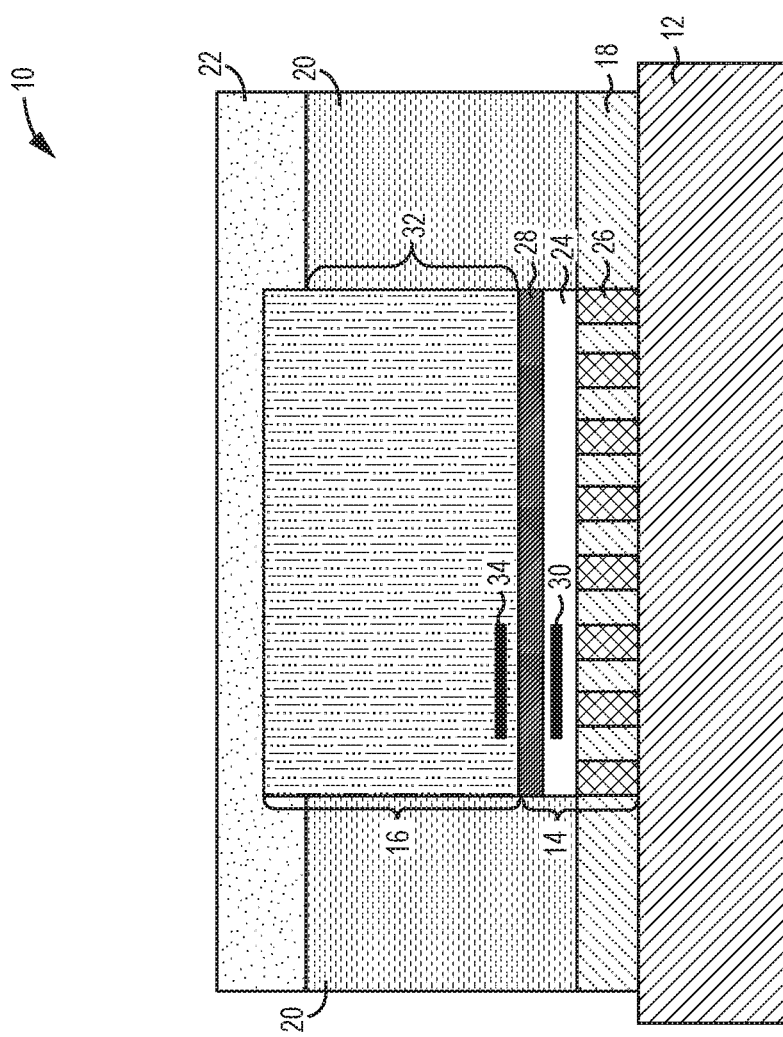
FIG. 2 shows an alternative microelectronics package with one self-aligned die according to one embodiment of the present disclosure.

In another embodiment, the second die 16 may be taller than the first opening 32 as illustrated in FIG. 2. The second die 16 is stacked with the first thinned flip chip die 14 and extends vertically beyond the first opening 32. The second mold compound 22 may reside over the first mold compound 20 and encapsulates the second die 16. Herein, the second mold compound 22 may be formed by a low compression molding process to prevent physical damage of the second die 16.

Figure 3:
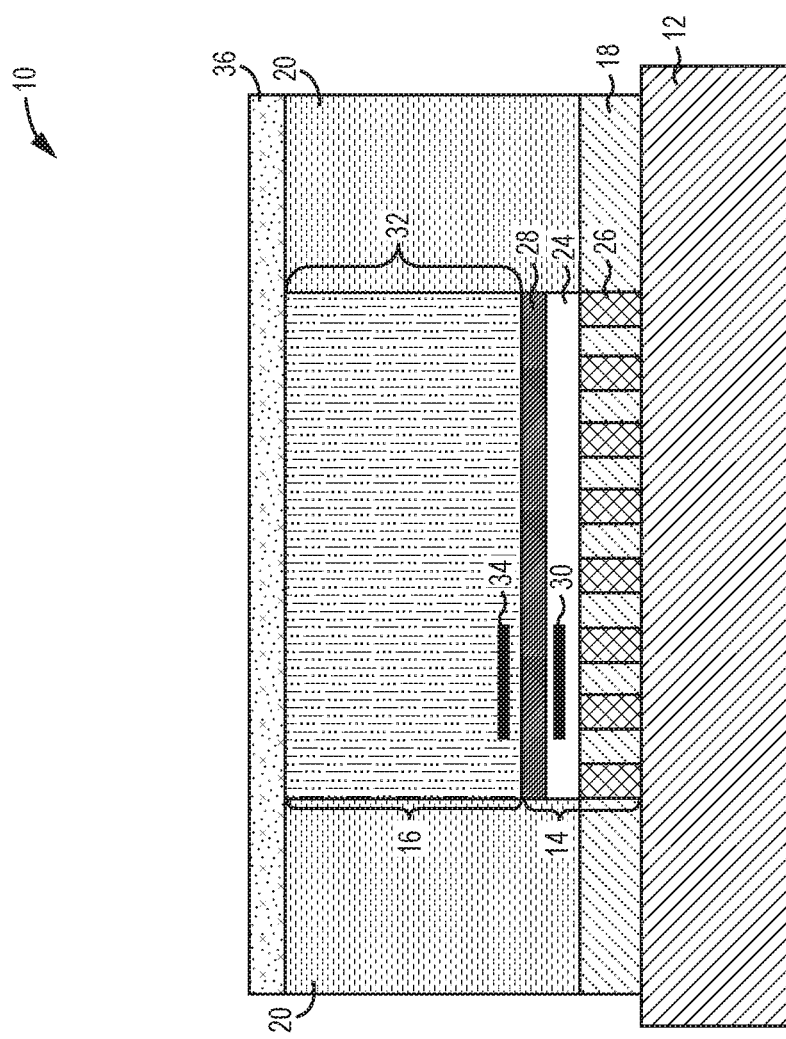
FIG. 3 shows an alternative microelectronics package with one self-aligned die according to one embodiment of the present disclosure.

Further, as shown in FIG. 3, an upper surface of the second die 16 and the upper surface of the first mold compound 20 are coplanar. A coating layer 36, instead of the second mold compound 22, may be applied over the upper surface of the first mold compound 20 to encapsulate the second die 16. The coating layer 36 may be formed of a same material as the underfilling layer 18, such as a sealing polymer, or may be formed of a thermal polymer or any other suitable material. In some applications, the microelectronics package 10 may not include the coating layer 36 or the second mold compound 22 to encapsulate the second die 16 (not shown). The upper surface of the second die 16 is exposed.

In one embodiment, a second thinned die 16T, instead of the second die 16, is stacked with the first thinned flip chip die 14, as illustrated in FIG. 4. The second thinned die 16T has a second device layer 38 directly over the upper surface of the first thinned flip chip die 14, a second dielectric layer 40 over the second device layer 38, and essentially no silicon substrate over the second dielectric layer 40. Herein, essentially no silicon substrate over the second dielectric layer 40 refers to at most 0.25 µm silicon substrate (not shown) over the second dielectric layer 40. In desired cases, the second thinned die 16T does not include any silicon substrate over the second dielectric layer 40, such that a top surface of the second thinned die 16T is a top surface of the second dielectric layer 40. For other cases, the top surface of the second thinned die 16T may be a top surface of the thin silicon substrate.

The second device layer 38 with a thickness between 0.1 µm and 50 µm may be formed of silicon, silicon oxide, gallium arsenide, gallium nitride, silicon germanium, or the like. Herein, the second inductive component 34 is embedded in the second device layer 38. The second dielectric layer 40 with a thickness between 10 nm and 10000 nm may be formed of silicon oxide, silicon nitride, or aluminum nitride. In one embodiment, the second thinned die 16T may be formed from an SOI die, an SOS die, an IPD die, or an acoustic die, any of which has a device layer, a semiconductor substrate and a stopping layer sandwiched between the device layer and the semiconductor substrate. The stopping layer may be formed of oxide or polymer and used as an etching stop to protect the device layer during an elimination process of the semiconductor substrate. For instance, the second device layer 38 of the second thinned die 16T is a silicon epitaxy layer with integrated electronic components of the SOI die. The second dielectric layer 40 of the second thinned die 16T is a BOX layer of the SOI die. In addition, a silicon substrate of the SOI die is removed substantially to complete the second thinned die 16T (more details in the following discussion).

Figure 5:
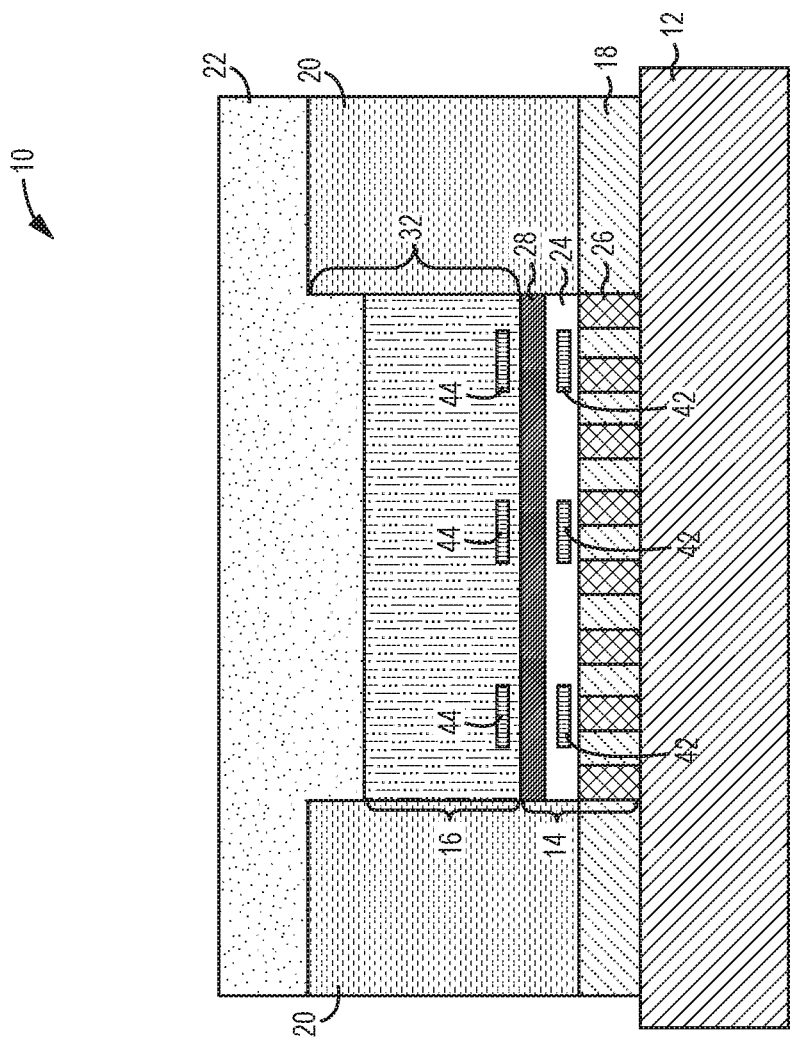
FIG. 5 shows an exemplary microelectronics package with one self-aligned die for optical energy transferring according to one embodiment of the present disclosure.

It will be clear to those skilled in the art that other coupling components, such as photonic components, capacitive coupled components, magnetically coupled components, and coupled vibrational sensors, may also be used to transfer different types of signal energies, such as electromagnetic energy, optical energy, thermal energy, vibration mechanical energy, acoustic wave energy, and X-ray energy. As shown in FIG. 5, a number of first photonic components 42 (photo detectors/emitters), instead of the first inductive component 30, are embedded in the first device layer 24 of the first thinned flip chip die 14, and a number of second photonic components 44 (photo emitters/detectors) instead of the second inductive component 34 are embedded in the second die 16. Each first photonic component 42 is mirrored to a corresponding second photonic component 44. Herein, the first thinned flip chip die 14 and the second die 16 do not have electrical connections, and the first thinned flip chip die 14 and the second die 16 convey signals to each other by transferring optical energy.

Figure 6:
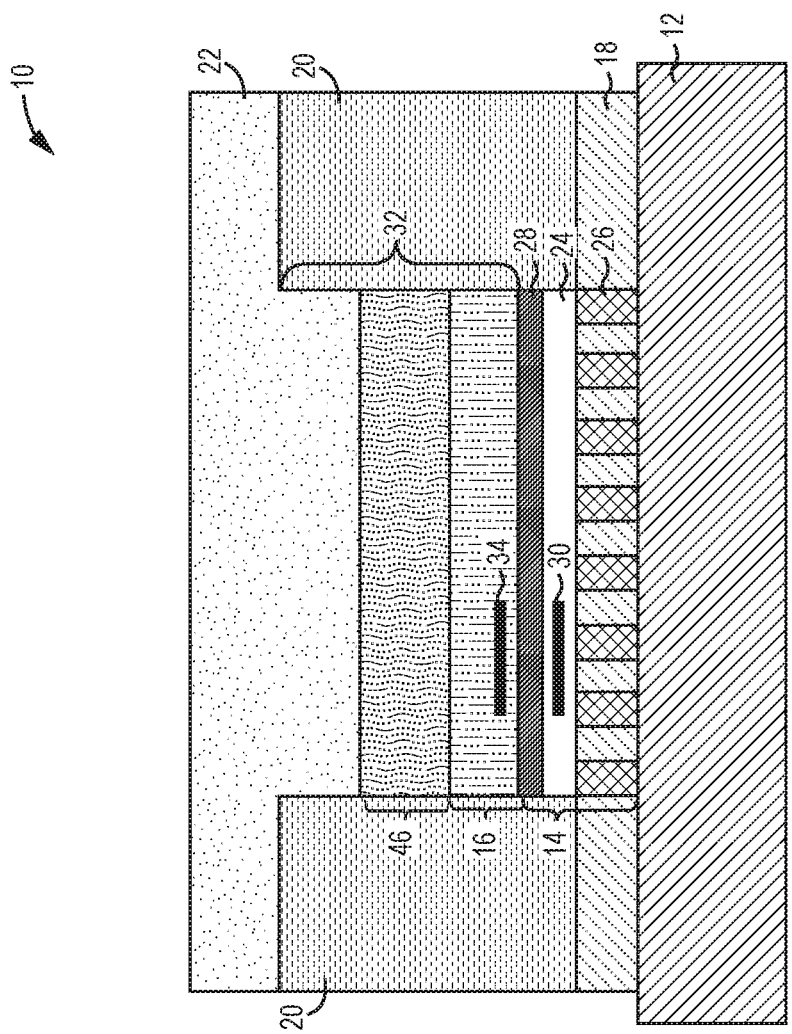
FIG. 6 shows an exemplary microelectronics package with multiple self-aligned dies according to one embodiment of the present disclosure.
Figure 7:
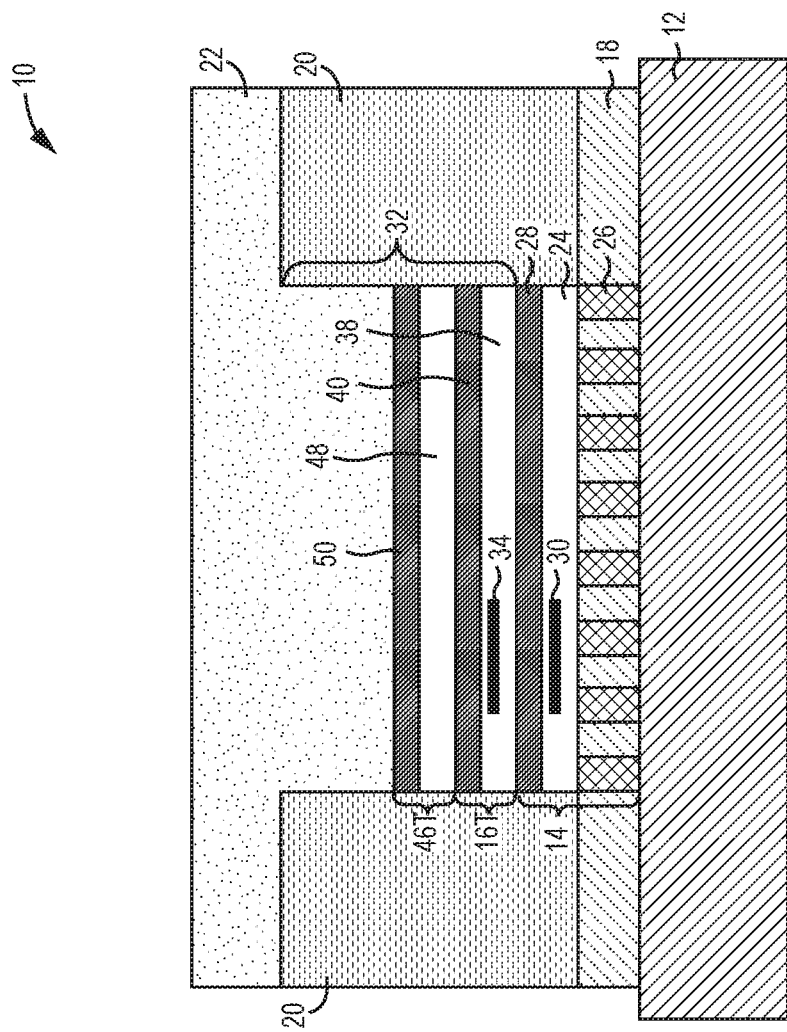
FIG. 7 shows an alternative microelectronics package with multiple self-aligned dies according to one embodiment of the present disclosure.
Figure 8:
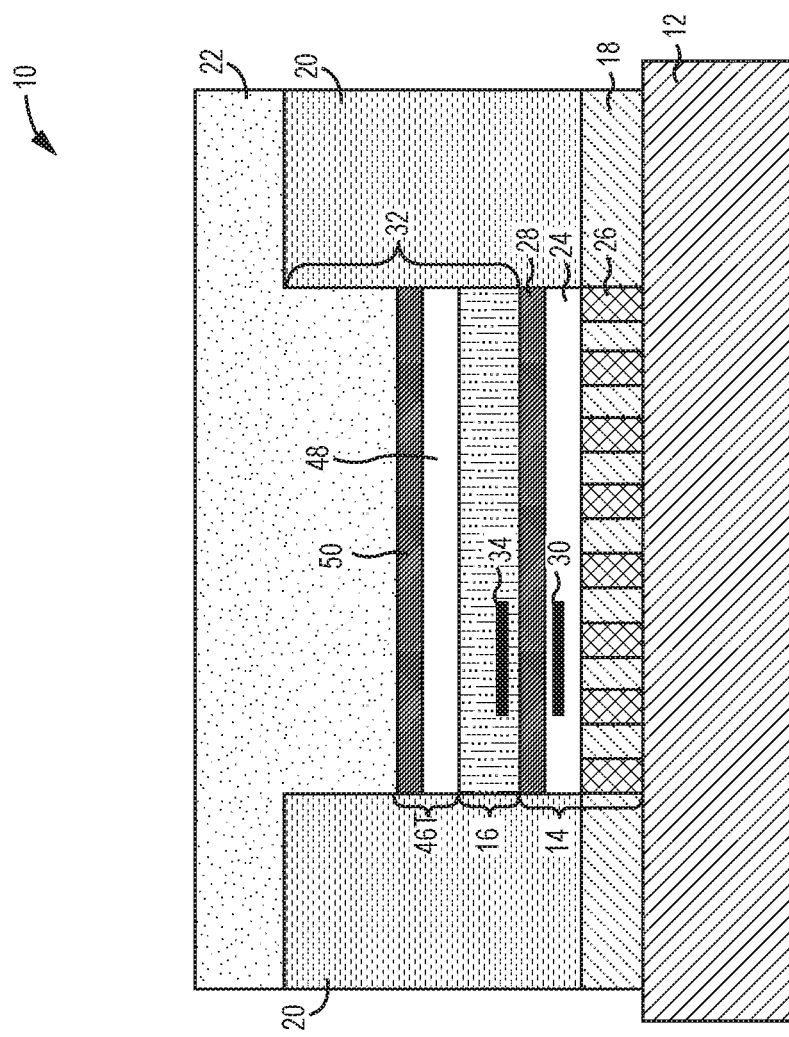
FIG. 8 shows an alternative microelectronics package with multiple self-aligned dies according to one embodiment of the present disclosure.

In some applications, the microelectronics package 10 may include multiple dies stacked with the first thinned flip chip die 14, as illustrated in FIGS. 6-8. In FIG. 6, the microelectronics package 10 includes the second die 16 and a third die 46 over the second die 16, both of which are stacked with the first thinned flip chip die 14. Herein, the second die 16 is fully within the first opening 32, and at least a portion of the third die 46 is in the first opening 32. The second mold compound 22 is in contact with and encapsulates the third die 46.

The third die 46 may have at least one of an X-direction dimension and a Y-direction dimension essentially the same as the first thinned flip chip die 14. Herein, essentially the same refers to between 95% and 100%. In detail, the X-direction dimension of the third die 46 may be between 95% and 100% of the X-direction dimension of the first thinned flip chip die 14, while the Y-direction dimension of the third die 46 may be smaller than the Y-direction dimension of the first thinned flip chip die 14. Alternatively, the Y-direction dimension of the third die 46 may be between 95% and 100% of the Y-direction dimension of the first thinned flip chip die 14, while the X-direction dimension of the third die 46 is smaller than the X-direction dimension of the first thinned flip chip die 14. In addition, the X-direction dimension of the third die 46 may be between 95% and 100% of the X-direction dimension of the first thinned flip chip die 14, and the Y-direction dimension of the third die 46 may be between 95% and 100% of the Y-direction dimension of the first thinned flip chip die 14. Consequently, at least one of the X-direction dimension and the Y-direction dimension of the third die 46 matches the first opening 32.

Notice that the first opening 32 is vertically over the first thinned flip chip die 14, and the first mold compound 20 provides the vertical walls of the first opening 32, which are well aligned with the edges of the first thinned flip chip die 14 in both the X-direction and the Y-direction. As such, the third die 46 stacked in the first opening 32 will be self-aligned with the first thinned flip chip die 14 due to the vertical walls of the first opening 32 provided by the first mold compound 20. Herein, the third die 46 and the second die 16 may have different dimensions in the X-direction, the Y-direction, and/or the Z direction, respectively.

As shown in FIG. 7, the second thinned die 16T and a third thinned die 46T are stacked with the first thinned flip chip die 14. The third thinned die 46T has a third device layer 48 directly over the upper surface of the second thinned die 16T, a third dielectric layer 50 over the third device layer 48, and essentially no silicon substrate over the third dielectric layer 50. Herein, essentially no silicon substrate over the third dielectric layer 50 refers to at most 0.25 µm silicon substrate (not shown) over the third dielectric layer 50. In desired cases, the third thinned die 46T does not include any silicon substrate over the third dielectric layer 50, such that a top surface of the third thinned die 46T is a top surface of the third dielectric layer 50. The third thinned die 46T may be formed from an SOI die, an SOS die, an IPD die, or an acoustic die. For instance, the third device layer 48 of the third thinned die 46T is a silicon epitaxy layer with integrated electronic components of the SOI die. The third dielectric layer 50 of the third thinned die 46T is a BOX layer of the SOI die. In addition, a silicon substrate of the SOI die is removed substantially to complete the third thinned die 46T.

Furthermore, the microelectronics package 10 may include the second die 16 and the third thinned die 46T stacked with the first thinned flip chip die 14, as illustrated in FIG. 8. And in some applications, the microelectronics package 10 may include the second thinned die 16T and the third die 46 stacked with the first thinned flip chip die 14 (not shown).

Figure 9:
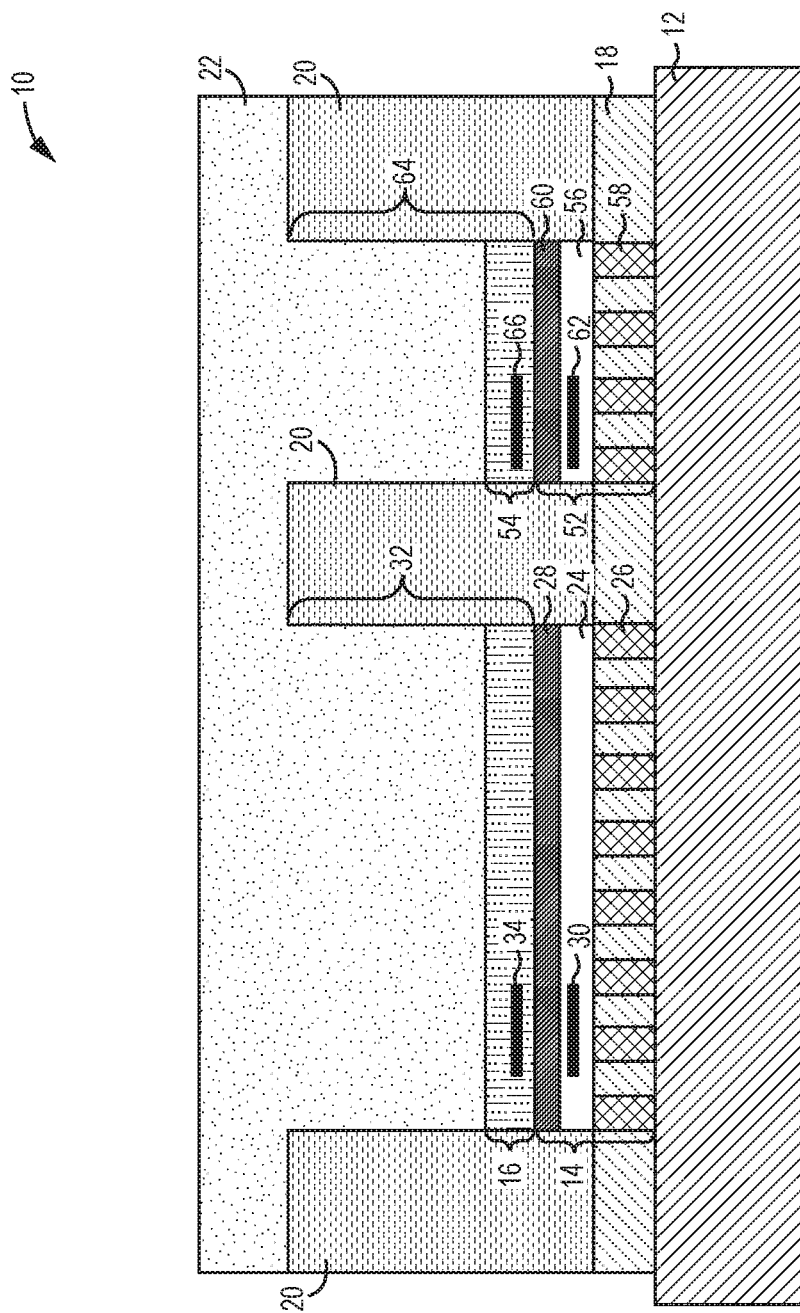
FIG. 9 shows an exemplary microelectronics package with multiple sets of self-aligned dies according to one embodiment of the present disclosure.

FIG. 9 shows that the microelectronics package 10 may include multiple sets of stacked dies attached to the module substrates 12. Besides the first thinned flip chip die 14 and the second die 16, the microelectronics package 10 also includes a fourth thinned flip chip die 52 and a fifth die 54. The fourth thinned flip chip die 52 includes a fourth device layer 56, a number of fourth interconnects 58 (only one interconnect is labeled with a reference number for clarity) extending from a lower surface of the fourth device layer 56 and coupled to the upper surface of the module substrate 12, a fourth dielectric layer 60 over an upper surface of the fourth device layer 56, and essentially no silicon substrate over the fourth dielectric layer 60. Herein, essentially no silicon substrate over the fourth dielectric layer 60 refers to at most 0.25 µm silicon substrate (not shown) over the fourth dielectric layer 60. In some applications, the fourth thinned flip chip die 52 does not include any silicon substrate, such that an upper surface of the fourth thinned flip chip die 52 is an upper surface of the fourth dielectric layer 60.

The fourth device layer 56 with a thickness between 0.1 µm and 50 µm may be formed of silicon, silicon oxide, gallium arsenide, gallium nitride, silicon germanium, or the like. A third inductive component 62 (such as inductor, transmission line, and coupler) is embedded within the fourth device layer 56. In different applications, there may be multiple inductive components included in the fourth device layer 56. The fourth interconnects 58 with a height between 5 µm and 200 µm may be copper pillar bumps, solder ball bumps, or the like. The fourth dielectric layer 60 with a thickness between 10 nm and 10000 nm may be formed of silicon oxide, silicon nitride, or aluminum nitride.

Similar to the first thinned flip chip die 14, the fourth thinned flip chip die 52 may be formed from an SOI die, an SOS die, an IPD die, or an acoustic die. The underfilling layer 18 encapsulates the fourth interconnects 58 and underfills the fourth thinned flip chip die 52 between the lower surface of the fourth device layer 56 and the upper surface of the module substrate 12. The first mold compound 20 also surrounds the fourth thinned flip chip die 52, and extends above the upper surface of the fourth thinned flip chip die 52 to define a second opening 64 within the first mold compound 20 and vertically above the upper surface of the fourth thinned flip chip die 52. Herein, the first mold compound 20 does not reside over the fourth thinned flip chip die 52 and provides vertical walls of the second opening 64 in the Z-direction. The vertical walls of the second opening 64 are well aligned with edges of the fourth thinned flip chip die 52 in both the X-direction and the Y-direction.

The fifth die 54 with a fourth inductive component 66 (such as inductor, transmission line, and coupler) is stacked with the fourth thinned flip chip die 52 and in the second opening 64. Herein, the fourth thinned flip chip die 52 and the fifth die 54 do not have electrical connections, and the fourth thinned flip chip die 52 and the fifth die 54 may convey signals to each other by magnetic coupling, which does not require such electrical connections. In this embodiment, the fourth inductive component 66 embedded in the fifth die 54 and the third inductive component 62 embedded in the fourth thinned flip chip die 52 are magnetically coupled and used to transfer signals between the fourth thinned flip chip die 52 and the fifth die 54.

The fifth die 54 has at least one of an X-direction dimension and a Y-direction dimension essentially the same as the fourth thinned flip chip die 52. Herein, essentially the same refers to between 95% and 100%. In detail, the X-direction dimension of the fifth die 54 may be between 95% and 100% of the X-direction dimension of the fourth thinned flip chip die 52, while the Y-direction dimension of the fifth die 54 may be smaller than the Y-direction dimension of the fourth thinned flip chip die 52. Alternatively, the Y-direction dimension of the fifth die 54 may be between 95% and 100% of the Y-direction dimension of the fourth thinned flip chip die 52, while the X-direction dimension of the fifth die 54 is smaller than the X-direction dimension of the fourth thinned flip chip die 52. In addition, the X-direction dimension of the fifth die 54 may be between 95% and 100% of the X-direction dimension of the fourth thinned flip chip die 52, and the Y-direction dimension of the fifth die 54 may be between 95% and 100% of the Y-direction dimension of the fourth thinned flip chip die 52. Consequently, at least one of the X-direction dimension and the Y-direction dimension of the fifth die 54 matches the second opening 64.

Notice that the first opening 32 is vertically over the first thinned flip chip die 14, and the first mold compound 20 provides the vertical walls of the second opening 64, which are well aligned with edges of the fourth thinned flip chip die 52 in both the X-direction and the Y-direction. As such, the fifth die 54 stacked in the second opening 64 will be self-aligned with the fourth thinned flip chip die 52 due to the vertical walls of the second opening 64 provided by the first mold compound 20. The precise alignment between the fourth flip chip die 52 and the fifth die 54 allows that the third inductive component 62 embedded in the fourth thinned flip chip die 52 is accurately mirrored to the fourth inductive component 66 embedded in the fifth die 54, and thus ensures stable magnetic coupling coefficients between the third inductive component 62 and the fourth inductive component 66 without an obvious variability. A distance between the third inductive component 62 and the fourth inductive component 66 is between 0.1 μm and 100 μm. In addition, the second mold compound 22 is in contact with and encapsulates the fifth die 54.

FIGS. 10A-10F provide exemplary steps to fabricate the exemplary wafer-level package 10 shown in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 10A-10F.

Figure 10A:
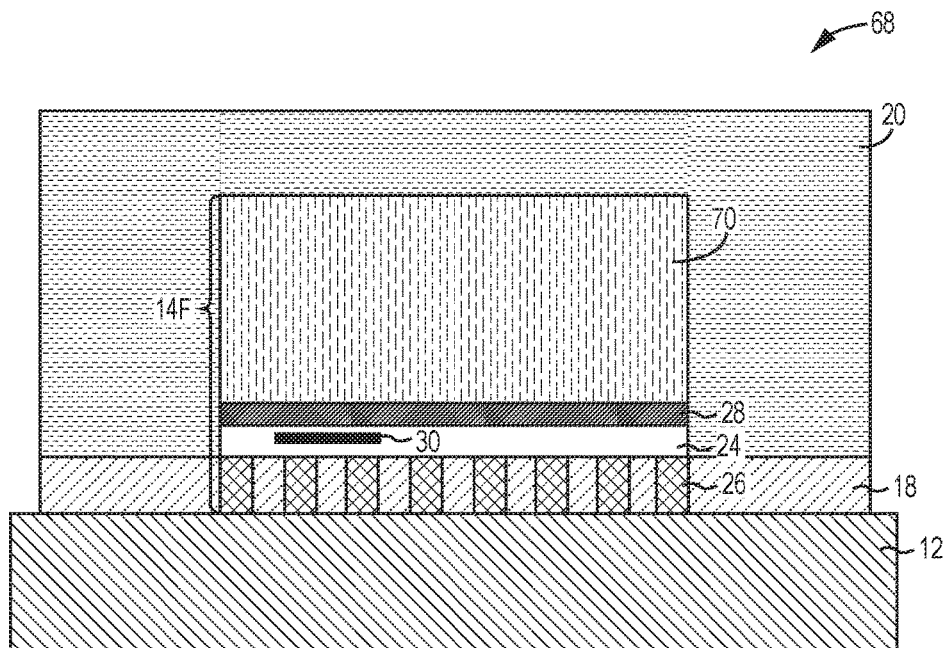

Initially, a precursor package 68 is provided as depicted in FIG. 10A. For the purpose of this illustration, the precursor package 68 includes the module substrate 12, a first flip chip die 14F, the underfilling layer 18, and the first mold compound 20. In different applications, the precursor package 68 may include multiple flip chip dies. In detail, the first flip chip die 14F includes the first device layer 24, the first interconnects 26 extending from the lower surface of the first device layer 24 to the upper surface of the module substrate 12, the first dielectric layer 28 over the upper surface of the first device layer 24, and a first silicon substrate 70 over the first dielectric layer 28. As such, the backside of the first silicon substrate 70 is an upper surface of the first flip chip die 14F. In addition, the underfilling layer 18 resides over the upper surface of the module substrate 12, such that the underfilling layer 16 encapsulates the first interconnects 26 and underfills the first flip chip die 14F between the lower surface of the first device layer 24 and the upper surface of the module substrate 12. The first mold compound 20 resides over the underfilling layer 18 and encapsulates the first flip chip die 14F. The first mold compound 20 may be used as an etchant barrier to protect the first flip chip die 14F against etching chemistries such as Tetramethylammonium hydroxide (TMAH), potassium hydroxide (KOH), sodium hydroxide (NaOH), and acetylcholine (ACH) in the following steps.

Figure 10B:
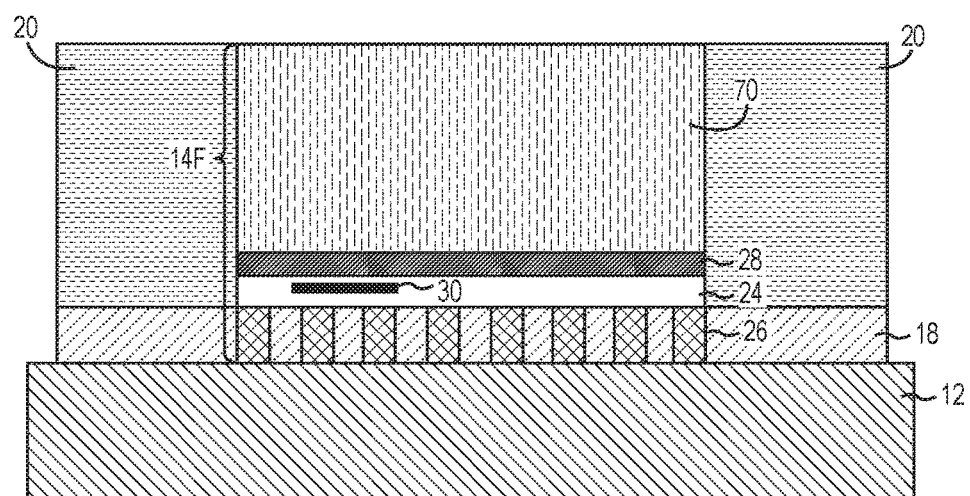
Figure 10C:
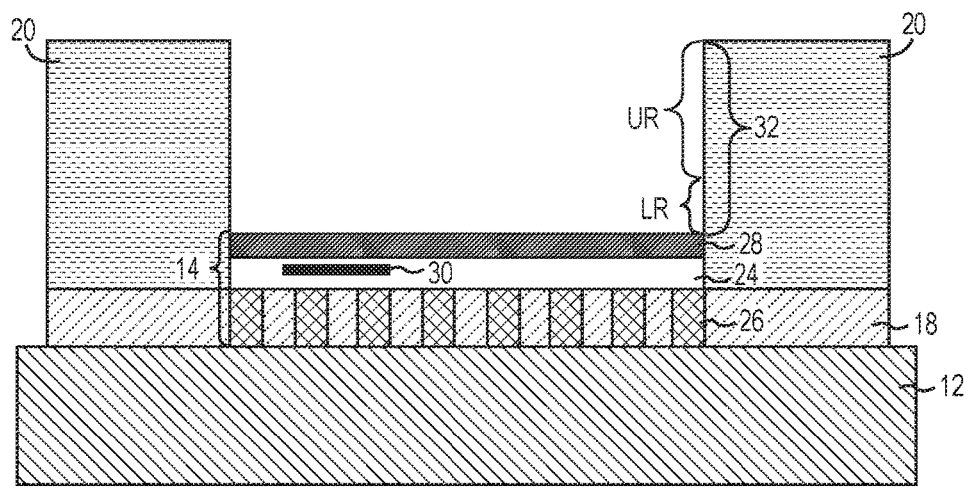

Next, the first mold compound 20 is thinned down to expose the backside of the first silicon substrate 70 of the first flip chip die 14F, as shown in FIG. 10B. The thinning procedure may be done with a mechanical grinding process. The following step is to remove substantially the first silicon substrate 70 of the first flip chip die 14F to create the first opening 32 and provide the first thinned flip chip die 14 with the upper surface exposed to the first opening 32, as shown in FIG. 10C. Herein, removing substantially the first silicon substrate 70 refers to removing at least 99% of the entire first silicon substrate 70, and perhaps a portion of the first dielectric layer 28. In desired cases, the first silicon substrate 70 is fully removed. As such, the first thinned flip chip die 14 may refer to a thinned die including the first device layer 24, the first interconnects 26 extending from the lower surface of the first device layer 24 and coupled to the module substrate 12, and the first dielectric layer 28 over the upper surface of the first device layer 24, where the upper surface of the first dielectric layer 28 is the upper surface of the first thinned flip chip die 14. Removing substantially the first silicon substrate 70 may be provided by an etching process with a wet/dry etchant chemistry, which may be TMAH, KOH, ACH, NaOH, or the like.

Since the first opening 32 is formed by removing the first silicon substrate 70 from the first flip chip die 14F, the first opening is the same size as the removed first silicon substrate 70 and consequently has the same X-direction dimension and the same Y-direction dimension as the thinned flip chip die 14. Herein, the first mold compound 20 surrounding the thinned flip chip die 14 provides vertical walls of the first opening 32, which are aligned with edges of the first thinned flip chip die 14 in both the X-direction and the Y-direction.

Figure 10D:
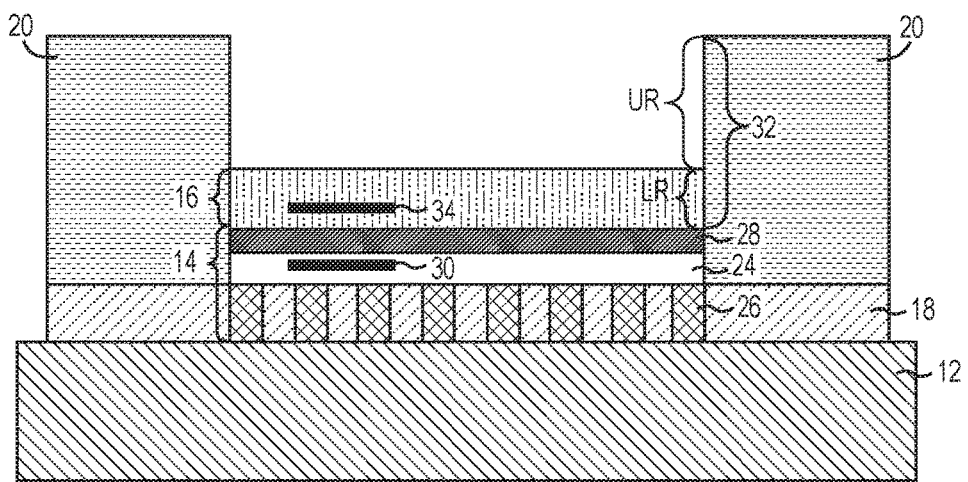

In this embodiment, the first opening 32 includes the lower region LR and the upper region UR that resides over the lower region LR, and the upper surface of the first thinned flip chip die 14 is exposed to the lower region LR of the first opening 32. The second die 16 is then placed within the lower region LR of the first opening 32 and stacked with the first thinned flip chip die 14, as illustrated in FIG. 10D. Herein, the first thinned flip chip die 14 and the second die 16 do not have electrical connections, and the first thinned flip chip die 14 and the second die 16 may convey signals to each other by magnetic coupling, which does not require electrical connections. Once the second die 16 has at least one of the X-direction dimension and the Y-direction dimension essentially the same as the first thinned flip chip die 14, at least one of the X-direction dimension and the Y-direction dimension of the second die 16 will match the first opening 32 that is surrounded by the first mold compound 20. Consequently, the second die 16 stacked in the first opening 32 is self-aligned with the first thinned flip chip die 14, which allows the first inductive component 30 embedded in the first thinned flip chip die 14 to be accurately mirrored to the second inductive component 34 embedded in the second die 16 and thus ensures a stable magnetic coupling coefficient between the first inductive component 30 and the second inductive component 34. In some cases, both the X-direction dimension and the Y-direction dimension of the second die 16 are essentially the same as the X-direction dimension and the Y-direction dimension of the first thinned flip chip die 14, respectively, such that both the X-direction dimension and the Y-direction dimension of the second die 16 match the first opening 32.

When placing the second die 16 in the first opening 32, the air between the second die 16 and the first thinned flip chip die 14 needs to be evacuated. If the second die 16 is formed from a laminate structure, one or more holes (not shown) may be formed vertically through the second die 16 to allow for air elimination. If the second die 16 is an IPD/LTCC/BAW filter/SAW filter/FBAR filter/active IC die, at least one of the X-direction dimension and the Y-direction dimension of the second die 16 may be 0.5-10 μm smaller than the first opening 32 to allow for air elimination without a significant inaccuracy in the self-aligned assembly. Further, the X-direction dimension and the Y-direction dimension of the second die 16 0.5-10 μm smaller than the first opening 32 may ensure a smooth placement of the second die 16 in the first opening 32. In some applications, there may be additional dies (not shown) placed in the first opening 32 and stacked with the first thinned flip chip die 14 and the second die 16.

Figure 10E:
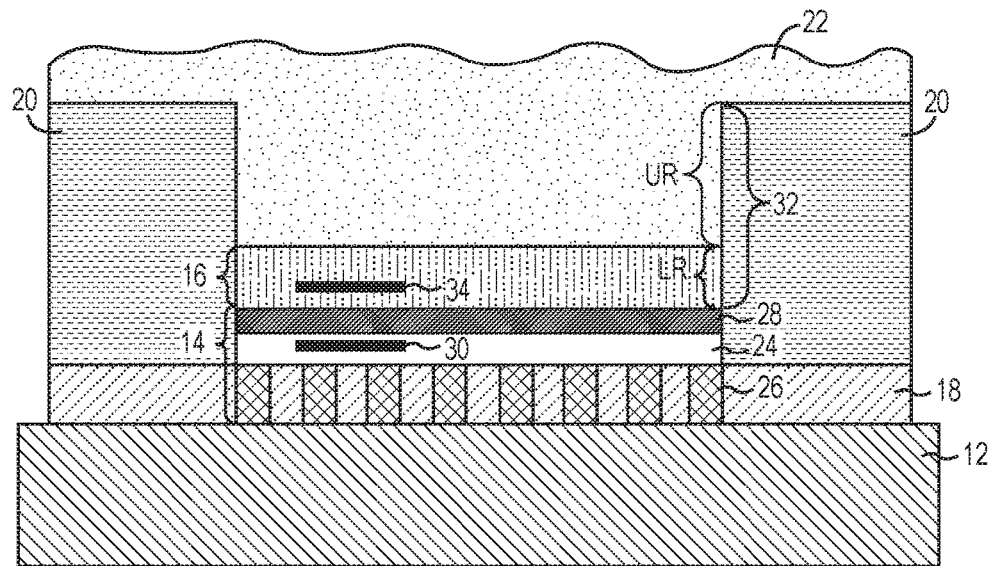

In this embodiment, after the second die 16 is placed in the lower region LR of the first opening 32, the second mold compound 22 is applied to substantially fill the upper region UR of the first opening 32 and encapsulate the second die 16, as depicted in FIG. 10E. Herein, substantially filling the upper region UR refers to filling at least 75% of the upper region UR. The second mold compound 22 directly resides over the upper surface of the second die 16 and may further reside over the first mold compound 20. The second mold compound 22 may be applied by various procedures, such as sheet molding, overmolding, compression molding, transfer molding, dam fill encapsulation, and screen print encapsulation.

In one embodiment, if the second die 16 is a high heat-generation die, the second mold compound 22 may be formed of thermoplastics or thermoset materials with a thermal conductivity greater than 2 W/m·K for superior heat dissipation. A typical molding pressure, between 250 psi and 1000 psi, may be used for applying the second mold compound 22. If the second die 16 is a low heat-generation die, the second mold compound 22 directly residing over the second die 16 is not required to have a high thermal conductivity. As such, the second mold compound 22 may be formed from an organic epoxy resin system with a thermal conductivity less than 2 W/m·K. A low molding pressure, as low as 100 psi, may be used for applying the second mold compound 22. The second mold compound 22 may be formed of the same or different material as the first mold compound 20. With the same material, the second mold compound 22 and the first mold compound 20 may have the same expansion/compression coefficients over temperature, which is desired in some applications.

Figure 10F:
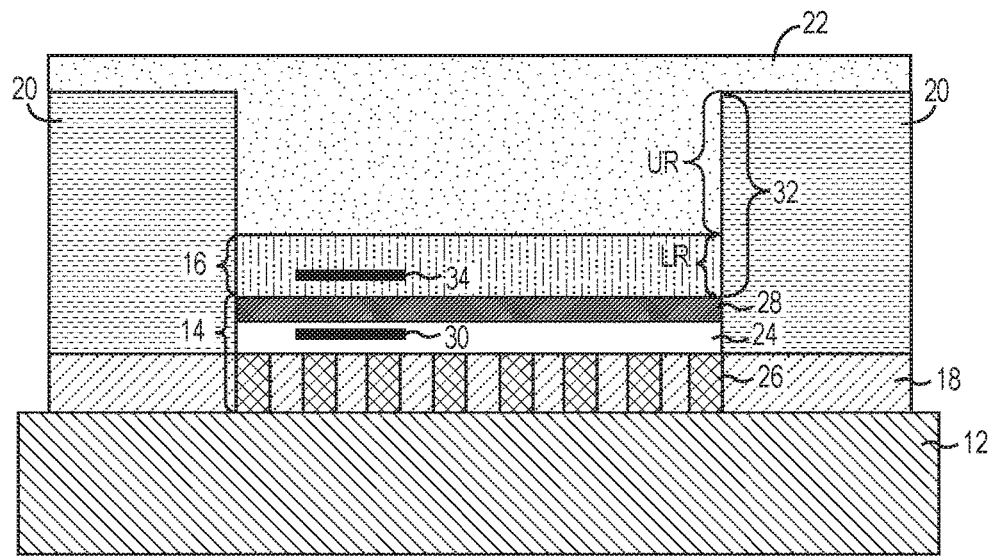

A curing process (not shown) is followed to harden the second mold compound 22. The curing temperature is between 100° C. and 320° C. depending on which material is used as the second mold compound 22. Finally, an upper surface of the second compound component 22 is planarized to form the microelectronic package 10 as depicted in FIG. 10F. A mechanical grinding process may be used for planarization. The upper portion of the second mold compound 22 may reside over the first mold compound 20.

FIGS. 11A-11G provide exemplary steps to fabricate the exemplary wafer-level package 10 shown in FIG. 4. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 11A-11G.

Figure 11A:
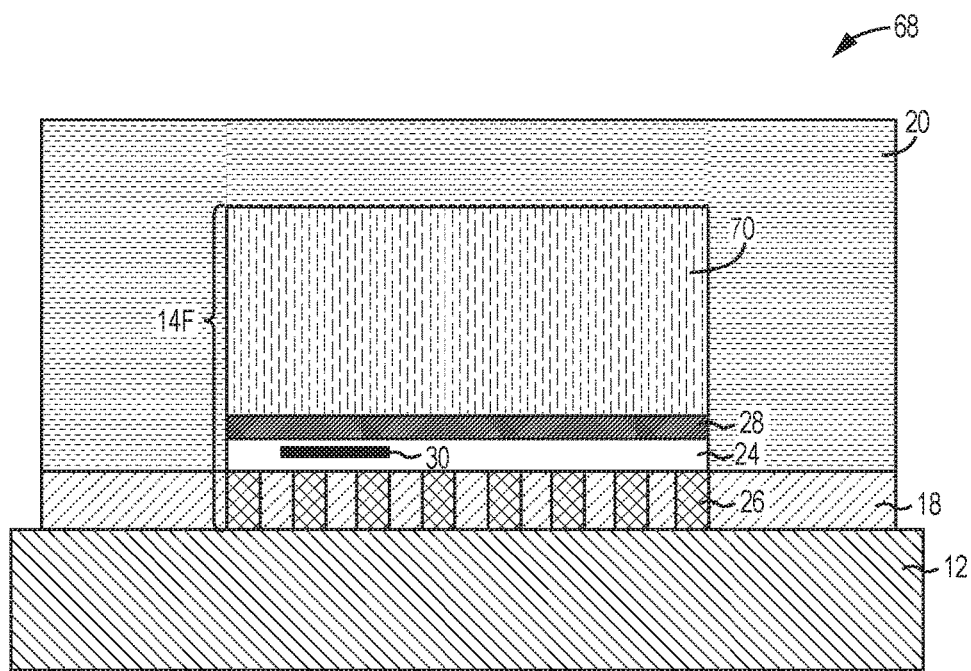
Figure 11B:
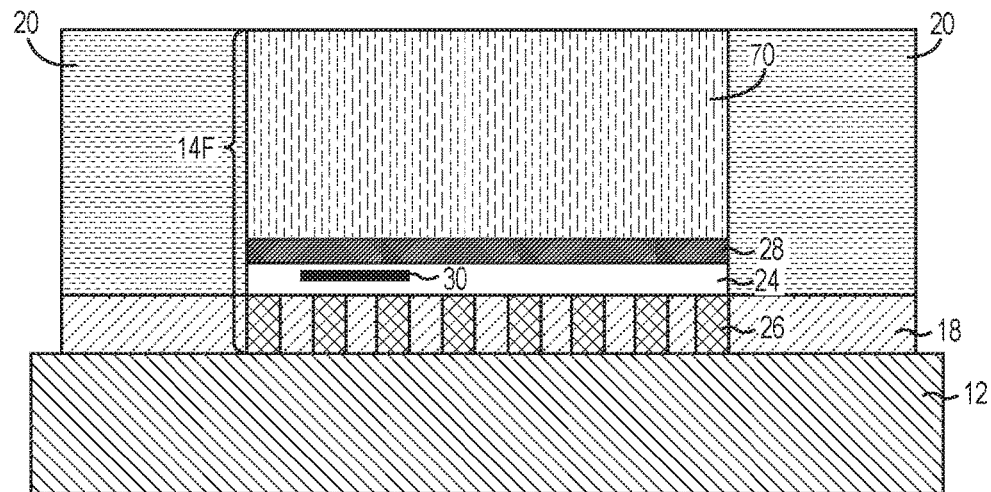
Figure 11C:
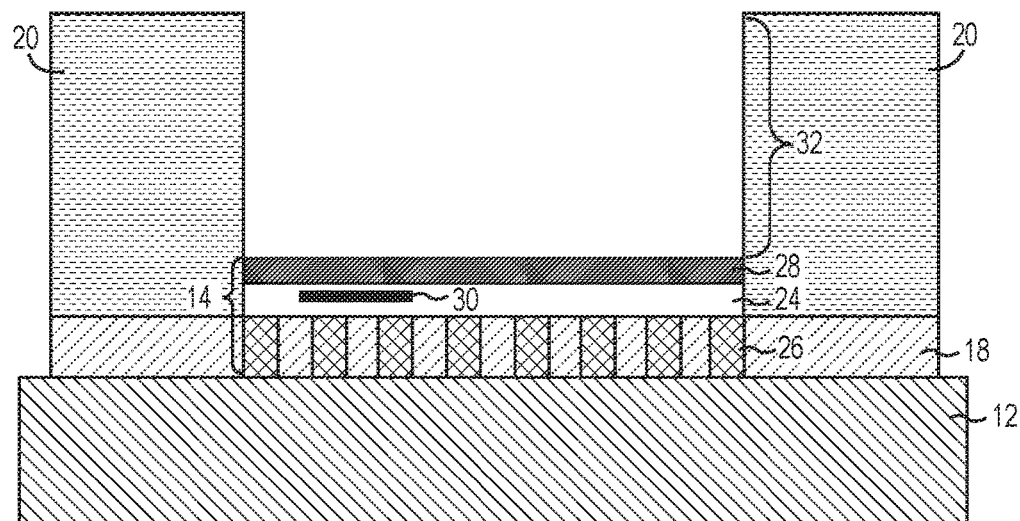

FIGS. 11A-11C show a same process to form the first thinned flip chip die 14 and the first opening 32 surrounded by the first mold compound 20 as FIGS. 10A-10C. Herein, the first opening 32 is vertically above the first thinned flip chip die 14, and the vertical walls of the first opening 32 provided by the first mold compound 20 are aligned with edges of the first thinned flip chip die 14 in both the X-direction dimension and the Y-direction dimension.

Figure 11D:
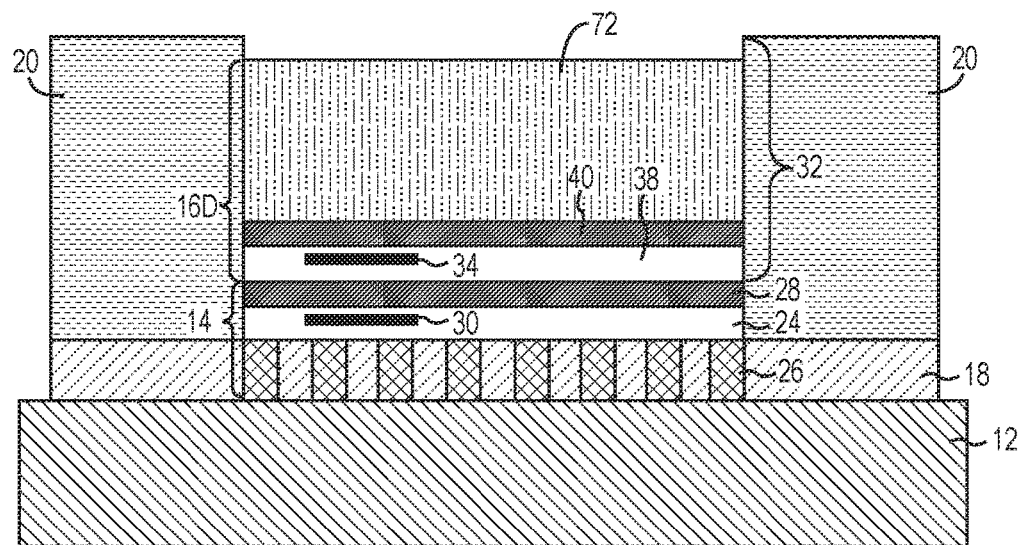

Next, a second intact die 16D is placed in the first opening 32 and stacked with the first thinned flip chip die 14, as illustrated in FIG. 11D. The second intact die 16D includes the second device layer 38 with the embedded second inductive component 34, the second dielectric layer 40 over the second device layer 38, and a second silicon substrate 72 over the second dielectric layer 40. As such, the backside of the second silicon substrate 72 is an upper surface of the second intact die 16D. In some applications, the second silicon substrate 72 may extend above the first opening 32. Herein, the second intact die 16D has at least one of an X-direction dimension and a Y-direction dimension essentially the same as the first thinned flip chip die 14, such that at least one of the X-direction dimension and the Y-direction dimension of the second intact die 16D matches the first opening 32 surrounded by the first mold compound 20. Consequently, the second intact die 16D stacked in the first opening 32 is self-aligned with the first thinned flip chip die 14, which allows the first inductive component 30 embedded in the first thinned flip chip die 14 to be accurately mirrored to the second inductive component 34 embedded in the second intact die 16D and thus ensures a stable magnetic coupling coefficient between the first inductive component 30 and the second inductive component 34. In some cases, both the X-direction dimension and Y-direction dimension of the second intact die 16D are essentially the same as the X-direction dimension and Y-direction dimension of the first thinned flip chip die 14, respectively, such that both the X-direction dimension and the Y-direction dimension of the second intact die 16D match the first opening 32. During the placement of the second intact die 16D in the first opening 32, the air between the second intact die 16D and the first thinned flip chip die 14 needs to be evacuated.

Figure 11E:
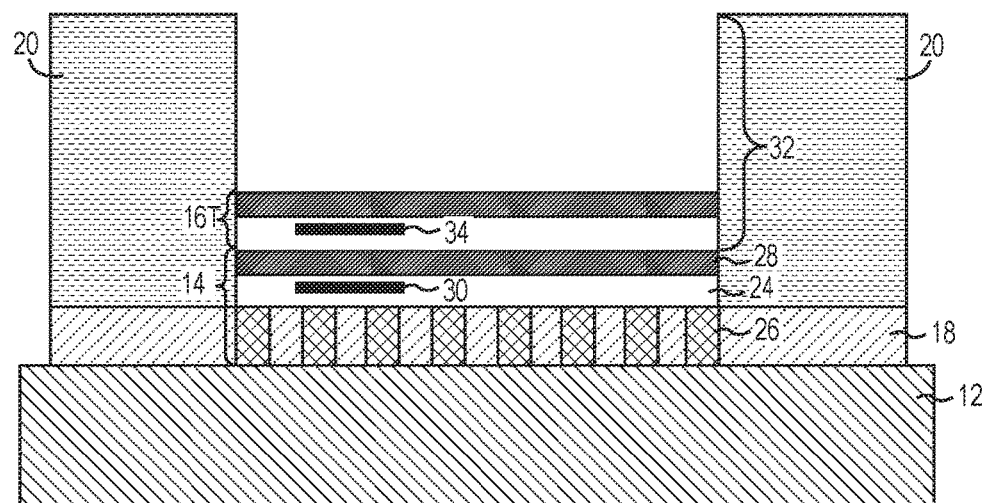

After the second intact die 16D is placed in the first opening 32, the second silicon substrate 72 is then removed substantially to release a portion of the first opening 32 and provide the second thinned die 16T, as illustrated in FIG. 11E. Removing substantially the second silicon substrate 72 may be provided by an etching process with a wet/dry etchant chemistry, which may be TMAH, KOH, ACH, NaOH, or the like. Herein, removing substantially the second silicon substrate 72 refers to removing at least 99% of the entire second silicon substrate 72, and perhaps a portion of the second dielectric layer 40. In desired cases, the second silicon substrate 72 is fully removed. As such, the second thinned die 16T may refer to a thinned die including the second device layer 38 and the second dielectric layer 40 over the second device layer 30, where the upper surface of the second dielectric layer 40 is the upper surface of the second thinned die 16T. The thinned second die 16T remains aligned with the first thinned flip chip die 14, and the upper surface of the second thinned die 16T is exposed in the first opening 32. In some applications, there may be additional dies (not shown) placed in the released portion of the first opening 32 and stacked with the first thinned flip chip die 14 and the second thinned die 16T.

Figure 11F:
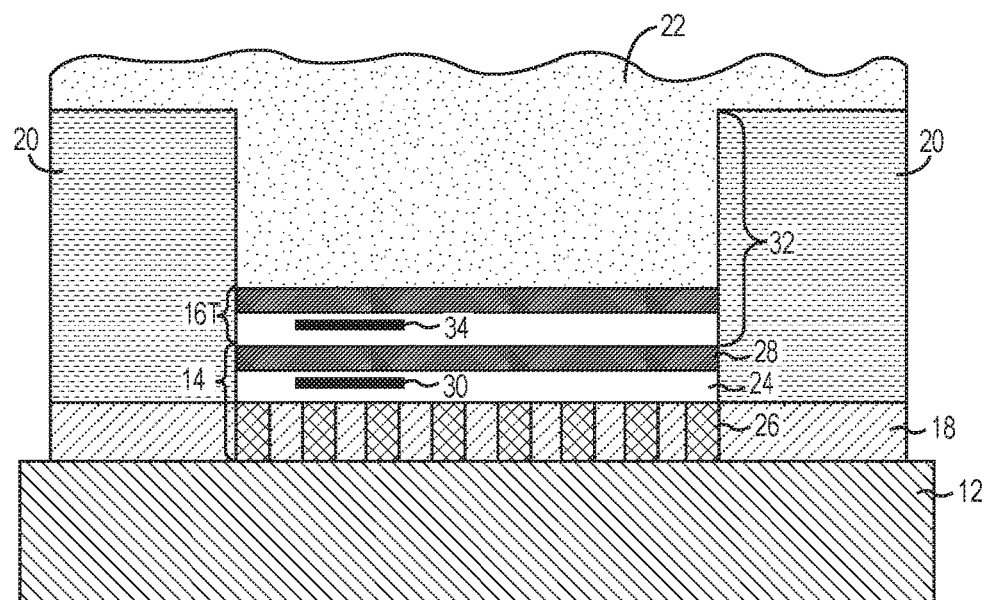

In this embodiment, after the second thinned die 16T is formed, the second mold compound 22 is applied to substantially fill the released portion of the first opening 32 and encapsulate the thinned second die 16T, as depicted in FIG. 11F. Herein, substantially filling the released portion of the first opening 32 refers to filling at least 75% of the released portion of the first opening 32. The second mold compound 22 directly resides over the upper surface of the second thinned die 16T and may further reside over the first mold compound 20. In general, the higher the thermal conductivity of the second mold compound 22, the better the thermal performance of the second thinned die 16T.

A curing process (not shown) is followed to harden the second mold compound 22. The curing temperature is between 100° C. and 320° C. depending on which material is used as the second mold compound 22. Finally, an upper surface of the second compound component 22 is planarized to form the microelectronic package 10 as depicted in FIG. 11G. A mechanical grinding process may be used for planarization. The upper portion of the second mold compound 22 may reside over the first mold compound 20.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
a module substrate having an upper surface;
a first thinned flip chip die comprising a first device layer, a first dielectric layer and a plurality of first interconnects, wherein:
the first device layer includes a first coupling component embedded therein;
the first dielectric layer resides over an upper surface of the first device layer; and
the plurality of first interconnects extends from a lower surface of the first device layer and is coupled to the upper surface of the module substrate;
a first mold compound residing over the upper surface of the module substrate, surrounding the first thinned flip chip die, and extending above an upper surface of the first thinned flip chip die to define a first opening within the first mold compound and vertically above the first thinned flip chip die, wherein:
the first mold compound does not reside over the first thinned flip chip die and provides vertical walls of the first opening, which are aligned with edges of the first thinned flip chip die in both X-direction and Y-direction;
the X-direction and the Y-direction are parallel to the upper surface of the module substrate, and the X-direction and the Y-direction are orthogonal to each other; and
the upper surface of the first thinned flip chip die is at a bottom of the first opening; and
a second die stacked with the first thinned flip chip die and in the first opening, wherein:
the first thinned flip chip die and the second die do not have electrical connections;
the second die comprises a second coupling component embedded therein; and
the second coupling component is mirrored to the first coupling component.

2. The apparatus of claim 1 wherein the second die has at least one of an X-direction dimension and a Y-direction dimension essentially the same as the first thinned flip chip die, such that the second die stacked in the first opening is self-aligned with the first thinned flip chip die.

3. The apparatus of claim 2 wherein the second die has both the X-direction dimension and the Y-direction dimension essentially the same as the first thinned flip chip die.

4. The apparatus of claim 1 wherein a distance between the first coupling component and the second coupling component is between 0.1 µm and 100 µm.

5. The apparatus of claim 1 wherein:
the first coupling component and the second coupling component are inductive components; and
the first coupling component is magnetically coupled to the second coupling component.

6. The apparatus of claim 1 wherein:
the first coupling component and the second coupling component are photonic components; and
the first coupling component is optically coupled to the second coupling component.

7. The apparatus of claim 1 wherein the first thinned flip chip die and the second die convey signals to each other by one type of energy from a group consisting of electromagnetic energy, optical energy, thermal energy, vibration mechanical energy, acoustic wave energy, and X-ray energy.

8. The apparatus of claim 1 wherein the first thinned flip chip die is formed from a silicon-on-insulator (SOI) die, wherein the first device layer of the first thinned flip chip die is a silicon epitaxy layer with integrated electronic components of the SOI die, and the first dielectric layer of the first thinned flip chip die is a buried oxide layer of the SOI die.

9. The apparatus of claim 1 further comprising a second mold compound encapsulating the second die.

10. The apparatus of claim 9 wherein the first mold compound is formed from a same material as the second mold compound.

11. The apparatus of claim 9 wherein the first mold compound and the second mold compound are formed from different materials.

12. The apparatus of claim 9 wherein:
the first opening includes a lower region and an upper region that resides over the lower region;
the second die resides within the lower region of the first opening; and
the second mold compound fills the upper region of the first opening and is in contact with the second die.

13. The apparatus of claim 9 wherein:
the second die extends vertically beyond the first opening; and
the second mold compound resides over the first mold compound and encapsulates the second die.

14. The apparatus of claim 1 wherein:
an upper surface of the second die and an upper surface of the first mold compound are coplanar; and
a coating layer is applied over the upper surface of the first mold compound to encapsulate the second die.

15. The apparatus of claim 1 wherein:
the second die is a thinned die that comprises a second device layer and a second dielectric layer over the second device layer;
the second device layer resides directly over the upper surface of the first thinned flip chip die; and
the second coupling component is embedded in the second device layer.

16. The apparatus of claim 15 wherein:
the first thinned flip chip die is formed from a first SOI die, wherein the first device layer of the first thinned flip chip die is a first silicon epitaxy layer with integrated electronic components of the first SOI die, and the first dielectric layer of the first thinned flip chip die is a first buried oxide layer of the first SOI die; and
the second die is formed from a second SOI die, wherein the second device layer of the second die is a second silicon epitaxy layer with integrated electronic components of the second SOI die, and the second dielectric layer of the second die is a second buried oxide layer of the second SOI die.

17. The apparatus of claim 1 further comprises a third die stacked with the first thinned flip chip die and the second die, wherein:
the first opening includes a lower region and an upper region that resides over the lower region;
the second die resides within the lower region of the first opening; and
the third die resides over the second die and in the upper region of the first opening.

18. The apparatus of claim 17 wherein:
the second die is a thinned die that comprises a second device layer and a second dielectric layer over the second device layer;
the second device layer resides directly over the upper surface of the first thinned flip chip die;
the second coupling component is embedded in the second device layer;
the third die is a thinned die that comprises a third device layer and a third dielectric layer over the third device layer; and
the third device layer resides directly over an upper surface of the second die.

19. The apparatus of claim 17 further comprising a second mold compound encapsulating the third die.

20. The apparatus of claim 1 further comprising a third thinned flip chip die and a fourth die, wherein:
the third thinned flip chip die comprises a second device layer, a second dielectric layer and a plurality of second interconnects;
the second device layer includes a third coupling component embedded therein;
the second dielectric layer resides over an upper surface of the second device layer;
the plurality of second interconnects extends from a lower surface of the second device layer and is coupled to the upper surface of the module substrate;
the first mold compound surrounds the third thinned flip chip die and extends above an upper surface of the third thinned flip chip die to define a second opening within the first mold compound and over the third thinned flip chip die, wherein the upper surface of the third thinned flip chip die is at a bottom of the second opening; and
the fourth die is stacked with the third thinned flip chip die and in the second opening;
the fourth die comprises a fourth coupling component embedded therein; and
the fourth coupling component is mirrored to the third coupling component.

21. The apparatus of claim 20 further comprising a second mold compound encapsulating the second die and the fourth die.

* * * * *